(12) United States Patent
Fukuhara et al.

(10) Patent No.: US 10,414,951 B2
(45) Date of Patent: Sep. 17, 2019

(54) TEMPORARY BONDING MATERIAL, LAMINATE, METHOD FOR MANUFACTURING LAMINATE, METHOD FOR MANUFACTURING DEVICE SUBSTRATE, AND METHOD FOR MANUFACTURING SEMICONDUCTOR DEVICE

(71) Applicant: FUJIFILM Corporation, Tokyo (JP)

(72) Inventors: Kei Fukuhara, Haibara-gun (JP); Yoshitaka Kamochi, Haibara-gun (JP); Mitsuru Sawano, Haibara-gun (JP)

(73) Assignee: FUJIFILM Corporation, Tokyo (JP)

(*) Notice: Subject to any disclaimer, the term of this patent is extended or adjusted under 35 U.S.C. 154(b) by 0 days.

(21) Appl. No.: 15/928,691

(22) Filed: Mar. 22, 2018

(65) Prior Publication Data

US 2018/0215965 A1 Aug. 2, 2018

Related U.S. Application Data

(63) Continuation of application No. PCT/JP2016/078437, filed on Sep. 27, 2016.

(30) Foreign Application Priority Data

Sep. 30, 2015 (JP) .................. 2015-195145

(51) Int. Cl.
| | | |
|---|---|---|
| *C09J 11/06* | (2006.01) | |
| *B32B 7/12* | (2006.01) | |
| *C09J 201/00* | (2006.01) | |
| *H01L 21/304* | (2006.01) | |
| *H01L 21/683* | (2006.01) | |
| *C09J 133/10* | (2006.01) | |
| *C09J 171/00* | (2006.01) | |
| *C09J 175/04* | (2006.01) | |
| *H01L 21/768* | (2006.01) | |
| *C09J 175/16* | (2006.01) | |
| *B32B 43/00* | (2006.01) | |
| *C08K 5/5419* | (2006.01) | |
| *B32B 38/10* | (2006.01) | |

(52) U.S. Cl.
CPC ............ *C09J 11/06* (2013.01); *B32B 7/12* (2013.01); *C09J 133/10* (2013.01); *C09J 171/00* (2013.01); *C09J 175/04* (2013.01); *C09J 175/16* (2013.01); *C09J 201/00* (2013.01); *H01L 21/304* (2013.01); *H01L 21/683* (2013.01); *H01L 21/6835* (2013.01); *H01L 21/6836* (2013.01); *H01L 21/76898* (2013.01); *B32B 38/10* (2013.01); *B32B 43/006* (2013.01); *B32B 2250/02* (2013.01); *B32B 2255/26* (2013.01); *B32B 2457/14* (2013.01); *C08G 2650/56* (2013.01); *C08K 5/5419* (2013.01); *H01L 2221/6834* (2013.01); *H01L 2221/68327* (2013.01); *H01L 2221/68372* (2013.01); *H01L 2221/68381* (2013.01); *H01L 2221/68386* (2013.01)

(58) Field of Classification Search
CPC ...... C09J 171/00; C09J 133/10; C09J 175/04; C09J 175/16; C09J 11/06
See application file for complete search history.

(56) References Cited

U.S. PATENT DOCUMENTS

| 4,999,242 A | 3/1991 | Ishiwata et al. |
|---|---|---|
| 2013/0285217 A1 | 10/2013 | Yamaguchi et al. |
| 2015/0034238 A1 | 2/2015 | Dronen et al. |
| 2016/0326409 A1 | 11/2016 | Tokuyasu et al. |

FOREIGN PATENT DOCUMENTS

| JP | 1-249878 A | 10/1989 |
|---|---|---|
| JP | 4-117475 A | 4/1992 |
| JP | 2012-52031 A | 3/2012 |
| JP | 2013-52031 A | 3/2012 |
| JP | 2013-241568 A | 12/2013 |
| JP | 2015-518270 A | 6/2015 |
| JP | 2015-126063 A | 7/2015 |
| WO | 2015/098949 A1 | 7/2015 |

OTHER PUBLICATIONS

Office Action dated Nov. 6, 2018, from Japanese Patent Office in counterpart Japanese Application No. 2017-543426.
International Search Report for PCT/JP2016/078437 dated Dec. 27, 2016 [PCT/ISA/210].
Written Opinion dated Dec. 27, 2016, issued by the International Bureau in Application No. PCT/JP2016/078437.
International Preliminary Report on Patentability issued from the International Bureau in International Application No. PCT/JP2016/078437, dated Apr. 3, 2018.

*Primary Examiner* — Peter D. Mulcahy
(74) *Attorney, Agent, or Firm* — Sughrue Mion, PLLC

(57) ABSTRACT

Provided are a temporary bonding material which is less likely to cause film unevenness and void formation while maintaining an adhesive force required for temporary bonding of a carrier substrate and a base material, and is easily peelable, a laminate, a method for manufacturing a laminate, a method for manufacturing a device substrate, and a method for manufacturing a semiconductor device.

A temporary bonding material of the present invention includes a thermoplastic resin, a compound having a Si—O structure in an amount of 0.001% by mass or more and less than 8% by mass of the thermoplastic resin, and a solvent, in which an adhesive force of the temporary bonding material of an adhesive in which the solvent is removed from the temporary bonding material with respect to a silicon wafer is 1 to 15 N/m. In addition, a laminate using the temporary bonding material, a method for manufacturing a laminate, a method for manufacturing a device substrate, and a method for manufacturing a semiconductor device are disclosed.

17 Claims, 1 Drawing Sheet

TEMPORARY BONDING MATERIAL, LAMINATE, METHOD FOR MANUFACTURING LAMINATE, METHOD FOR MANUFACTURING DEVICE SUBSTRATE, AND METHOD FOR MANUFACTURING SEMICONDUCTOR DEVICE

CROSS-REFERENCE TO RELATED APPLICATIONS

This application is a Continuation of PCT International Application No. PCT/JP2016/078437 filed on Sep. 27, 2016, which claims priority under 35 U.S.C § 119(a) to Japanese Patent Application No. 2015-195145 filed on Sep. 30, 2015. Each of the above application(s) is hereby expressly incorporated by reference, in its entirety, into the present application.

BACKGROUND OF THE INVENTION

1. Field of the Invention

The present invention relates to a temporary bonding material, a laminate, a method for manufacturing a laminate, a method for manufacturing a device substrate, and a method for manufacturing a semiconductor device.

2. Description of the Related Art

In the manufacturing process of semiconductor devices such as an integrated circuit (IC) and a large scale integrated circuit (LSI), a large number of IC chips are formed on a device wafer and diced by dicing.

With the needs for further miniaturization and higher performance of electronic devices, further miniaturization and higher integration of IC chips mounted on the electronic device are required. However, the high integration of an integrated circuit in the plane direction of a device wafer is close to the limit.

As a method for an electrical connection of an integrated circuit in an IC chip to an external terminal of the IC chip, a wire bonding method has been heretofore widely known. In order to achieve miniaturization of the IC chip, in recent years, a method where a through-hole is provided in a device wafer and a metal plug, as the external terminal, is connected to the integrated circuit so as to pass through the through-hole (a method for forming a so-called through-silicon electrode (TSV)) has been known. However, with the method for forming a through-silicon electrode alone, the needs of higher integration for IC chip in recent years as described above have not been sufficiently fulfilled.

In consideration of the circumstances, there is known a technique for improving the integration density per unit area of the device wafer by making the integrated circuit in an IC chip multilayered. However, since a multilayered integrated circuit increases the thickness of the IC chip, it is required to make members constituting the IC chip thin. As to the thinning of the members, for example, thinning of the device wafer has been studied and is promising to not only lead to the miniaturization of an IC chip but also to save labor in a through-hole producing step of the device wafer in the production of a through-silicon electrode. In addition, thinning has also been attempted in semiconductor devices such as a power device and an image sensor, from the viewpoint of improving the integration density and improving the degree of freedom of device structures.

A wafer having a thickness of about 700 to 900 μm is widely known as the device wafer. In recent years, for the purpose of miniaturization of an IC chip, it has been attempted to reduce the thickness of a device wafer to 200 μm or less.

However, a device wafer having a thickness of 200 μm or less is very thin and thus, a member for producing a semiconductor device using such a device wafer as a base material is also very thin. Therefore, in a case, for example, where the member is subjected to an additional treatment or where the member is simply moved, or the like, it is difficult to support the member stably while not damaging the member.

In order to solve the problems described above, there is known a technique in which a device wafer having a device provided on the surface thereof before thinning is performed is temporarily bonded to a carrier substrate with a temporary bonding material, a rear surface of the device wafer is ground to make the wafer thin, and then the carrier substrate is peeled off from the device wafer.

Based on the circumstances, JP2015-518270A discloses a laminate including a carrier substrate, a peeling layer which is arranged on the carrier substrate, a junction layer which is arranged on the peeling layer and is in contact with the peeling layer, and a substrate which is arranged on the junction layer and is in contact with the junction layer, in which the peeling layer includes a certain amount of an adhesiveness modifier. In addition, it is described that the peeling layer includes a polymer prepared from polymerization of at least one monomer having a free radical reactive group. Further, it is described that the adhesiveness modifier includes silicone (meth)acrylate.

Further, JP2012-52031A discloses a processing method of a layer to be processed including (1) a step of forming an adhesive layer, which is an adhesive layer containing a polymer (A) and a photo radical generator (B) and in 100% by weight of the adhesive layer and having a content of a polymerizable compound of 10% by weight or less, on a support, (2) a step of forming a layer to be processed on the adhesive layer, (3) a step of processing the layer to be processed, (4) a step of emitting light to the adhesive layer from the support side, and (5) a step of peeling off the processed layer to be processed from the support in this order.

In addition, JP2015-126063A discloses a resin composition for temporary fixing which includes (A) a thermoplastic resin and (B) a silicone modified resin and is a resin composition for temporary fixing for forming a film-shaped temporary fixing member used in a processing method of a semiconductor wafer including a temporary fixing step of temporarily fixing a semiconductor wafer to a support through the film-shaped temporary fixing member, a processing step of processing the semiconductor wafer temporarily fixed to the support, and a peeling step of peeling the processed semiconductor wafer from the support and the film-shaped temporary fixing member.

SUMMARY OF THE INVENTION

Here, in JP2015-518270A, at least one monomer having a free radical reactive group is formulated as a resin component of a temporary bonding material, and silicone (meth)acrylate as a release agent reacting to the monomer is further formulated. Then, the composition is applied to the surface of the substrate, bonded, and photocured. However, it is found that since the temporary bonding material disclosed in JP2015-518270A is a liquid temporary bonding material, film unevenness occurs or voids are formed. In addition, needless to say, an adhesive force required as a temporary bonding material is also required.

On the other hand, in the example of JP2012-52031A, a temporary bonding material obtained by formulating an organic modified polysiloxane to a thermoplastic resin is disclosed. Since this temporary bonding material exhibits excessively high adhesive strength, laser peeling is performed and the number of steps at the time of peeling is increased.

The present invention is provided to solve the problems and an object thereof is to provide a temporary bonding material which is less likely to cause film unevenness and void formation while maintaining an adhesive force required for temporary bonding of a carrier substrate and a base material, a laminate, a method for manufacturing a laminate, a method for manufacturing a device substrate, and a method for manufacturing a semiconductor device.

As a result of conducting investigations by the present inventors based on the problems, it has been found that the use of a thermoplastic resin by changing the resin into a monomer can solve the above problems. Specifically, the above problems are solved by <1>, and preferably <2> to <19>.

<1> A temporary bonding material comprising: a thermoplastic resin; a compound having a Si—O structure in an amount of 0.001% by mass or more and less than 8% by mass of the thermoplastic resin; and a solvent, in which an adhesive force of a temporary bonding layer in which the solvent is removed from the temporary bonding material with respect to a silicon wafer is 1 to 15 N/m.

<2> The temporary bonding material according to <1>, in which the thermoplastic resin is at least one selected from an acrylic resin, a urethane resin, and a phenoxy resin.

<3> The temporary bonding material according to <1> or <2>, in which the compound having a Si—O structure does not have an ethylenically unsaturated bond.

<4> The temporary bonding material according to any one of <1> to <3>, in which the thermoplastic resin is at least one selected from an acrylic resin, a urethane resin, and a phenoxy resin, and the compound having a Si—O structure does not have an ethylenically unsaturated bond.

<5> The temporary bonding material according to <1> or <2>, in which the compound having a Si—O structure is silicone (meth)acrylate.

<6> A laminate comprising, in order: a carrier substrate; a temporary bonding layer formed by curing the temporary bonding material according to any one of <1> to <5>; and a base material.

<7> The laminate according to <6>, in which at least a part of the temporary bonding layer is in contact with a surface of the base material.

<8> The laminate according to <7>, in which a chip is provided between the temporary bonding layer and the base material.

<9> The laminate according to any one of <6> to <8>, in which the number of temporary bonding layers is 2 or more.

<10> The laminate according to <9>, in which an amount of a compound having a Si—O structure included in a first temporary bonding layer is different from an amount of a compound having a Si—O structure included in a second temporary bonding layer.

<11> The laminate according to any one of <6> to <10>, in which the carrier substrate and the base material each independently have a transmittance of 50% or less at a wavelength of 365 nm.

<12> A method for manufacturing a laminate comprising: providing a temporary bonding layer on at least one of a carrier substrate or a base material using the temporary bonding material according to any one of <1> to <5>.

<13> A method for manufacturing a laminate comprising: providing temporary bonding layers, each independently on both a carrier substrate and a base material using the temporary bonding material according to any one of <1> to <5>.

<14> The method for manufacturing a laminate according to <12> or <13>, in which the carrier substrate and the base material each independently have a transmittance of 50% or less at a wavelength of 365 nm.

<15> A method for manufacturing a device substrate comprising: processing the base material of the laminate according to any one of <6> to <11>.

<16> The method for manufacturing a device substrate according to <15>, further comprising: performing heating at 150° C. or higher.

<17> The method for manufacturing a device substrate according to <15> or <16>, further comprising: peeling off the carrier substrate from the laminate at 40° C. or lower.

<18> The method for manufacturing a device substrate according to <17>, further comprising: removing the temporary bonding layer from the laminate from which the carrier substrate is peeled off at 40° C. or lower.

<19> A method for manufacturing a semiconductor device comprising: the method for manufacturing a device substrate according to any one of <15> to <18>.

According to the present invention, it is possible to provide a temporary bonding material which is less likely to cause film unevenness and void formation while maintaining an adhesive force required for temporary bonding of a carrier substrate and a base material, a laminate in which a substrate to be processed can be easily peeled off after processing, a method for manufacturing a laminate, a method for manufacturing a device substrate, and a method for manufacturing a semiconductor device.

DESCRIPTION OF THE PREFERRED EMBODIMENTS

Figure 1:
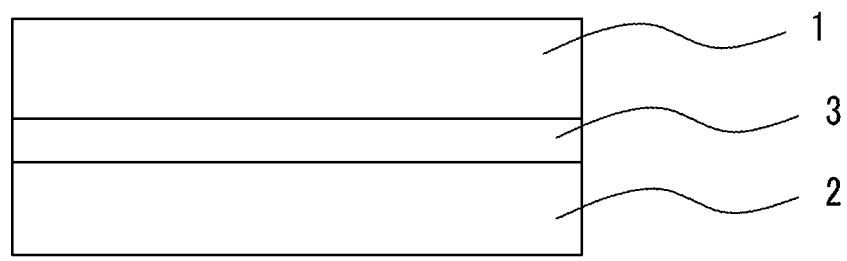
FIG. 1 is a schematic view showing an embodiment of a laminate according to the present invention.

Hereinafter, the contents of the present invention will be described in detail. In addition, "to" in the present specification means the range covering the numerical values before and after "to" as the lower and upper limits, respectively.

In the present specification, notation of a group (atomic group) without specifying whether the group is substituted or unsubstituted is used to encompass not only a group having no substituent, but also a group having a substituent. For example, an "alkyl group" encompasses not only an alkyl group having no substituent (unsubstituted alkyl group), but also an alkyl group having a substituent (substituted alkyl group).

In the present specification, the term "actinic rays" or "radiation" means to encompass, for example, visible rays, ultraviolet rays, far ultraviolet rays, electron beams, X-rays, and the like.

In the present specification, the term "light" means actinic rays or radiation.

In the present specification, unless otherwise specified, the term "exposure" encompasses not only exposure to a mercury lamp, ultraviolet rays, far ultraviolet rays typified by excimer laser, X-rays, extreme ultraviolet (EUV) rays or the like, but also lithography with particle beams such as electron beams and ion beams.

In the present specification, the term "(meth)acrylate" means acrylate and methacrylate, the term "(meth)acrylic" means acrylic and methacrylic, and the term "(meth)acryloyl" means "acryloyl" and "methacryloyl".

In the present specification, a weight-average molecular weight (Mw) is defined as a value obtained by gel permeation chromatography (GPC) measurement in terms of polystyrene. In the present specification, the weight-average molecular weight can be determined, for example, using an HLC-8220 (manufactured by Tosoh Corporation), and a TSKgel Super AWM-H (6.0 mm (inner diameter)×15.0 cm, manufactured by Tosoh Corporation) as a column. The measurement is carried out using a 10 mmol/L lithium bromide N-methylpyrrolidinone (NMP) solution as an eluent.

In the present specification, the term "lipophilic group" means a functional group not including a hydrophilic group. In addition, the term "hydrophilic group" means a functional group exhibiting affinity with water.

A temporary bonding material of the present invention includes a thermoplastic resin, 0.001% by mass or more and less than 8% by mass of a compound having a Si—O structure, and a solvent, and the adhesive force of a temporary bonding layer of an temporary bonding material from which the solvent is removed with respect to a silicon wafer is 1 to 15 N/m. By adopting such a structure, it is possible to provide a temporary bonding material which is less likely to cause film unevenness and void formation while maintaining an adhesive force required for a temporary bonding material of the carrier substrate and the base material, and with which a substrate to be processed is easily peeled off from the carrier substrate after processing.

Herein, the adhesive force of the temporary bonding material of the temporary bonding layer in which the solvent is removed from the temporary bonding material with respect to the silicon wafer is measured according to "Evaluation of Adhesive force" in examples which will be described later. However, in a case where a measurement machine or the like is discontinued, a measurement machine having other similar performance or the like can be used instead.

The adhesive force is 1 to 15 N/m, more preferably 2 to 10 N/m, even more preferably 2 to 5 N/m, and particularly preferably 2 to 3 N/m.

In JP2015-518270A, using a temporary bonding material to which an acrylate monomer and a release agent which reacts with the acrylate monomer are added, a carrier substrate and a base material are laminated and then the temporary bonding material is photocured. Therefore, in JP2015-518270A, in a case where the carrier substrate and the base material are laminated, the temporary bonding material is a liquid and the acrylate monomer is a fluid. Thus, film unevenness is easily caused in the temporary bonding layer or voids are easily formed. In the present invention, by formulating a thermoplastic resin and a solvent instead of the monomer, using the temporary bonding layer from which the solvent is dried, the carrier substrate and the base material can be laminated. Thus, a certain degree of hardness can be imparted to the temporary bonding layer and film unevenness and void formation can be suppressed.

In JP2012-52031A, since the adhesive force of the thermoplastic resin is excessively strong, laser exfoliation has to be performed, and thus an unnecessary step is required. In the present invention, the adhesive force of the thermoplastic resin is controlled by adjusting the amount of the compound having a Si—O structure and thus peeling can be performed without performing a pretreatment using laser or the like.

In addition, in the present invention, since photocuring is not required, reduction of the number of steps can be expected.

Further, in JP2015-518270A, since photocuring is performed by formulating an acrylate monomer having an ethylenically unsaturated bond as a release agent to an acrylate monomer, the release agent is also photocured and thus is not able to move in the temporary bonding layer. In the present invention, in a case where the compound having a Si—O structure is able to move in the temporary bonding layer at a certain degree, uneven distribution of the compound having a Si—O structure can be utilized. That is, since the compound having a Si—O structure is unevenly distributed on the surface of the temporary bonding layer and functions as a release agent, the amount of the compound having a Si—O structure formulated in the temporary bonding material can be relatively reduced.

The temporary bonding material in the present invention refers to a temporary bonding material used for temporarily fixing a base material and a carrier substrate. The base material typically has a metal structure such as a bump, a pillar, or a circuit surface but is not required to have the metal structure. Materials subjected to any processing can be widely employed. The details of the base material and the carrier substrate will be described later.

<Thermoplastic Resin>

The temporary bonding material of the present invention includes a thermoplastic resin. Here, for example, the thermoplastic resin is a compound having a weight-average molecular weight of 2,000 or more.

The thermoplastic resin typically excludes a compound corresponding to the compound having a Si—O structure in an amount of 0.001% by mass or more and less than 10% by mass of the total amount of the thermoplastic resin included in the temporary bonding material. The thermoplastic resin is more preferably a compound having a weight-average molecular weight 2,000 to 100,000.

The thermoplastic resin used in the present invention is preferably a solid at 25° C.

Examples of the thermoplastic resin in the present invention include an acrylic resin, a urethane resin, a phenoxy resin, a siloxane polymer, a cycloolefin-based polymer, an epoxy resin, a polycarbonate resin, and a polyimide resin, and an acrylic resin, a urethane resin, and a phenoxy resin are preferable, and an acrylic resin is more preferable.

<<Acrylic Resin>>

The acrylic resin in the present invention is a resin obtained by polymerizing a (meth)acrylate monomer.

Examples of (meth)acrylate monomer include 2-ethylhexyl(meth)acrylate, ethyl(meth)acrylate, methyl(meth)acrylate, n-propyl(meth)acrylate, isopropyl(meth)acrylate, pentyl(meth)acrylate, n-octyl(meth)acrylate, isooctyl(meth)acrylate, isononyl(meth)acrylate, n-butyl(meth)acrylate, isobutyl(meth)acrylate, hexyl(meth)acrylate, n-nonyl(meth)acrylate, isoamyl(meth)acrylate, n-decyl(meth)acrylate, isodecyl(meth)acrylate, dodecyl(meth)acrylate, isobornyl(meth)acrylate, cyclohexyl(meth)acrylate, phenyl(meth)acrylate, benzyl meth(acrylate), and 2-methylbutyl(meth)acrylate.

In addition, within a range not departing from the gist of the present invention, other monomers may be copolymerized. In a case of copolymerizing other monomers, the amount of other monomers is preferably 10% by mole or less of the total monomer.

In the present invention, an acrylic resin having organopolysiloxane in a side chain is also preferable. Examples of the resin having organopolysiloxane in the side chain include a resin represented by Formula (3).

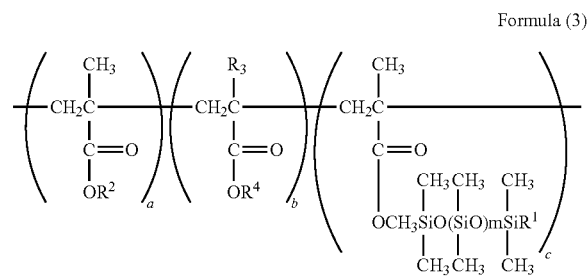

Formula (3)

In Formula (3), in a case where a plurality of $R^1$'s are present, $R^1$'s may be the same as or different from each other and represent $CH_3$, $C_2H_5$, $CH_3(CH_2)_2$, or $CH_3(CH_2)_3$. In a case where a plurality of $R^2$'s are present, $R^2$'s may be the same as or different from each other and represent H, $CH_3$, $C_2H_5$, $CH_3(CH_2)_2$ or $CH_3(CH_2)_3$. In a case where a plurality of $R^3$'s are present, $R^3$'s may be the same as or different from each other and represent H or $CH_3$. In a case where a plurality of $R^4$'s are present, $R^4$'s may be the same as or different from each other and represent H, $CH_3$, $C_2H_5$, $CH_3(CH_2)_2$, $CH_3(CH_2)_3$, or an alkyl group having 1 to 6 carbon atoms substituted with at least one functional group selected from the group consisting of an epoxy group, a hydroxyl group, a carboxyl group, an amino group, an alkoxy group, a vinyl group, a silanol group, and an isocyanate group. a represents 50 to 150, b represents 50 to 150, and c represents 80 to 600. In addition, m represents 1 to 10.

Specific examples of the acrylic resin having organopolysiloxane in the side chain include silicone graft acrylic resin, trade names: X-24-798A, X-22-8004 ($R^4$: $C_2H_4OH$, functional group equivalent: 3,250 g/mol), X-22-8009 ($R^4$: $Si(OCH_3)_3$-containing alkyl group, functional group equivalent: 6,200 g/mol), X-22-8053 ($R^4$: H, functional group equivalent: 900 g/mol), X-22-8084, X-22-8084EM, and X-22-8195 ($R^4$: H, functional group equivalent: 2,700 g/mol), manufactured by Shin-Etsu Chemical Co., Ltd., and SYMAC series (US-270, US-350, US-352, US-380, US-413, US-450, and the like), and RESEDA GS-1000 series (GS-1015, GS-1302, and the like), manufactured by TOAGOSEI CO., LTD.

In addition to the above resins, ACRYPET MF 001, manufactured by MITSUBISHI RAYON CO., LTD. may be exemplified.

<<Urethane Resin>>

The polyurethane resin is synthesized by a reaction between a diisocyanate compound and a diol compound (a compound having at least two hydroxyl groups), and the polyurethane resin is a polyurethane resin having a structural unit represented by a reaction product of at least one diisocyanate compound represented by Formula (41) and at least one diol compound represented by Formula (51) as a basic skeleton.

OCN—$X^0$—NCO      Formula (41)

HO—$Y^0$—OH      Formula (51)

In Formulae (41) and (51), $X^0$ and $Y^0$ each independently represent a divalent organic residue.

As long as at least one of the diisocyanate compound represented by Formula (41) or the diol compound represented by Formula (51) has at least one of the groups represented by Formulae (11) to (31), as the reaction product of the diisocyanate compound and the diol compound, a polyurethane resin in which the groups represented by Formulae (11) to (31) are introduced in the side chain is produced. According to the method, the polyurethane resin in which the groups represented by Formulae (11) to (31) are introduced in the side chain can be more easily produced in substitution or introduction of a desired side chain after reaction production the polyurethane resin.

Formulae (11) to (31) are as follows.

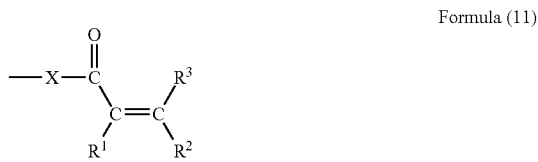

Formula (11)

In Formula (11), $R^1$ to $R^3$ each independently represent a hydrogen atom or a monovalent group. Herein, examples of the monovalent group include a halogen atom, an alkyl group, an alkenyl group, an alkynyl group, a cycloalkyl group, a cycloalkenyl group, an aryl group, a heterocyclic group, an alkoxy group, an aryloxy group, an alkylthio group, an arylthio group, an amino group, an alkylamino group, an arylamino group, an acylamino group, a sulfonamide group, an alkyl or arylsulfonyl group, an alkyl or arylsulfinyl group, an alkoxycarbonyl group, an aryloxycarbonyl group, an acyl group, an acyloxy group, a carbamoyl group, a sulfamoyl group, a hydroxy group, a mercapto group, a cyano group, a nitro group, a carboxyl group, a sulfo group, a ureide group, and a urethane group, and these groups may be further substituted with these substituents. In addition, examples of the monovalent organic group or the substituent in each group and each formula below include the same groups.

$R^1$ preferably represents an alkyl group which may have a hydrogen atom or a substituent, and among these, from the viewpoint of high radical reactivity, a hydrogen atom and a methyl group are more preferable. In addition, $R^2$ and $R^3$ each independently preferably represent a hydrogen atom, a halogen atom, an amino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent, and an arylsulfonyl group which may have a substituent, and among these, from the viewpoint of high radical reactivity, a hydrogen atom, a carboxyl group, an alkoxycarbonyl group, an alkyl group which may have a substituent, and an aryl group which may have a substituent are more preferable.

X represents an oxygen atom, a sulfur atom, or —N($R^{12}$)—, and $R^{12}$ represents a hydrogen atom or a monovalent organic group. $R^{12}$ preferably represents alkyl groups which may have a substituent and among these, from the viewpoint of high radical reactivity, a hydrogen atom, a methyl group, an ethyl group, and an isopropyl group are more preferable.

Herein, substituents that the above respective groups may have (substituents that can be introduced in alkyl groups which may have a substituent or the like) are not particularly limited and can be appropriately selected according to the purpose. Examples thereof include groups mentioned in the monovalent group, and a halogen atom, an alkyl group, an alkenyl group, an alkynyl group, an aryl group, an alkoxy group, an aryloxy group, an alkylthio group, an arylthio group, an amino group, an alkylamino group, an arylamino group, an acylamino group, a carbamoyl group, an alkoxycarbonyl group, an alkylsulfonyl group, an arylsulfonyl group, a carboxyl group a sulfo group, a nitro group, and a cyano group are preferable.

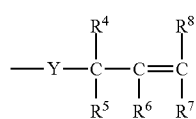

Formula (21)

In Formula (21), $R^4$ to $R^8$ each independently represent a hydrogen atom or a monovalent organic group. $R^4$ to $R^8$ are not particularly limited and can be appropriately selected according to the purpose. Herein, examples of the monovalent organic group include groups mentioned in $R^1$ to $R^3$ in Formula (11). $R^4$ to $R^8$ preferably represent a hydrogen atom, a halogen atom, an amino group, an alkylamino group which may have a substituent, a dialkylamino group which may have a substituent, an arylamino group which may have a substituent, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylsulfonyl group which may have a substituent, and an arylsulfonyl group which may have a substituent, and among these, from the viewpoint of high radical reactivity, a hydrogen atom, a carboxyl group, an alkoxycarbonyl group, an alkyl group which may have a substituent, and an aryl group which may have a substituent are more preferable.

Examples of substituents that the above respective groups may have include the same substituents as in Formula (11). In addition, Y represents an oxygen atom, a sulfur atom, or —N($R^{12}$)—. $R^{12}$ has the same meaning as in the case of $R^{12}$ in Formula (11) and the preferable example is also the same.

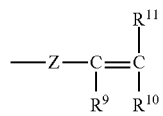

Formula (31)

In Formula (31), $R^9$ to $R^{11}$ each independently represent a hydrogen atom or a monovalent organic group. Herein, examples of the monovalent organic group include groups mentioned in $R^1$ to $R^3$ in Formula (11). $R^9$ preferably represents a hydrogen atom or an alkyl group which may have a substituent, and among these, from the viewpoint of high radical reactivity, a hydrogen atom, or a methyl group is more preferable. $R^{10}$ and $R^{11}$ preferably represent a hydrogen atom, a halogen atom, an amino group, an alkylamino group which may have a substituent, a dialkylamino group which may have a substituent, an arylamino group which may have a substituent, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylsulfonyl group which may have a substituent, and an arylsulfonyl group which may have a substituent, and among these, from the viewpoint of high radical reactivity, a hydrogen atom, a carboxyl group, an alkoxycarbonyl group, an alkyl group which may have a substituent, and an aryl group which may have a substituent are more preferable.

Herein, examples of substituents which the above respective groups may have the same substituents as in Formula (11). In addition, Z represents an oxygen atom, a sulfur atom, —N($R^{11}$)—, or a phenylene group which may have a substituent. $R^{13}$ represents a hydrogen atom or a monovalent organic group. $R^{13}$ preferably represents alkyl groups which may have a substituent and among these, from the viewpoint of high radical reactivity, a methyl group, an ethyl group, or an isopropyl group is more preferable.

Among the groups represented by Formulae (11) to (31), the group represented by Formula (11) is preferable, and from the viewpoint of crosslinking curable film formability, a group in which $R^1$ in Formula (11) represents a methyl group and $R^2$ and $R^3$ represent a hydrogen atom, a group in which all of $R^1$ to $R^3$ in Formula (11) represent a hydrogen atom, and a styryl group in which Z in Formula (31) represents a phenylene group are preferable, and a group in which $R^1$ in Formula (11) represents a methyl group and $R^2$ and $R^3$ represent a hydrogen atom, and a group in which all of $R^1$ to $R^3$ in Formula (11) represent a hydrogen atom are more preferable. From the viewpoint of both the formability and storability of a crosslinking curable film, a group in which $R^1$ in Formula (11) represents a methyl group and $R^2$ and $R^3$ represent a hydrogen atom is particularly preferable. Herein, X in Formula (11) preferably represents an oxygen atom, and as an ethylenically unsaturated group, among these, a methacryloyloxy group or an acryloyloxy group is preferable, and a methacryloyloxy group is most preferable.

The diisocyanate compound represented by Formula (41) is not particularly limited and can be appropriately selected according to the purpose. For example, a product obtained by addition reaction between a triisocyanate compound and 1 equivalent of a monofunctional alcohol or a monofunctional amine compound having an unsaturated group may be exemplified.

The triisocyanate compound is not particularly limited and can be appropriately selected according to the purpose. For example, compounds described in paragraphs 0034 to 0035 of JP2005-250438A may be exemplified.

The monofunctional alcohol or the monofunctional amine compound having an unsaturated group is not particularly limited and can be appropriately selected according to the purpose. For example, compounds described in paragraphs 0037 to 0040 of JP2005-250438A may be exemplified.

The diisocyanate compound in the method using the diisocyanate compound having an unsaturated group in the side chain is not particularly limited and can be appropriately selected according to the purpose. The diisocyanate compound is a diisocyanate compound that can be obtained by addition reaction between a triisocyanate compound and 1 equivalent of a monofunctional alcohol or a monofunctional amine compound having an unsaturated group, and for example, compounds having an unsaturated group in the side chain described in paragraphs 0042 to 0049 of JP2005-250438A may be exemplified.

The polyurethane resin can be copolymerized with a diisocyanate compound other than a diisocyanate compound containing an ethylenically unsaturated group from the viewpoint of improving storage stability by improving compatibility with other components in the polymerizable composition.

The diisocyanate compound to be copolymerized is not particularly limited and can be appropriately selected according to the purpose. For example, a diisocyanate compound represented by Formula (6) may be exemplified.

$$OCN-L^1-NCO \quad \text{Formula (6)}$$

In Formula (6), $L^1$ represents a divalent aliphatic or aromatic hydrocarbon group which may have a substituent. If necessary, $L^1$ may have other functional groups which do not react with an isocyanate group and may have, for example, an ester group, a urethane group, an amide group, and a ureido group.

The diisocyanate compound represented by Formula (6) is not particularly limited and can be appropriately selected according to the purpose. Examples thereof include aromatic diisocyanate compounds such as 2,4-tolylene diisocyanate, a dimer of 2,4-tolylene diisocyanate, 2,6-tolylene diisocyanate, p-xylylene diisocyanate, m-xylylene diisocyanate, 4,4'-diphenylmethane diisocyanate, 1,5-naphthylene diisocyanate, 3,3'-dimethylbiphenyl-4,4'-diisocyanate; aliphatic diisocyanate compounds such as hexamethylene diisocyanate, trimethylhexamethylene diisocyanate, lysin diisocyanate, and dimeric acid diisocyanate; alicyclic diisocyanate compounds such as isophorone diisocyanate, 4,4'-methylenebis(cyclohexylisocyanate), methylcyclohexane-2,4(or 2,6) diisocyanate and 1,3-(isocyanatomethyl)cyclohexane; and diisocyanate compounds as reaction products from diols and diisocyanates such as an adduct of 1 mole of 1,3-butyleneglycol and 2 moles of tolylene diisocyanate.

The diisocyanate compound represented by Formula (41) or (6) (particularly, the diisocyanate compound represented by Formula (6)) may be used by combining different kinds of diisocyanate compounds but from the viewpoint of being capable of improving folding resistance, at least one aromatic diisocyanate compound is preferably used. As the aromatic diisocyanate compound, for example, a diisocyanate compound having a skeleton of bisphenol A type (hereinafter, also referred to as a 2,2-diphenylpropane type), bisphenol F type (hereinafter, also referred to as a diphenylmethane type), biphenyl type, naphthalene type, phenanthrene type, or anthracene type is preferable, and a diisocyanate compound having a skeleton of bisphenol A type or bisphenol F type is more preferable.

Each type of skeleton is represented by the following formulae.

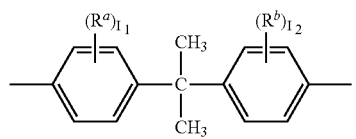

Bisphenol A type

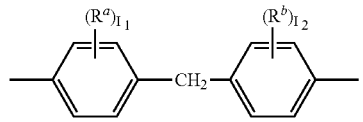

Bisphenol F type

-continued

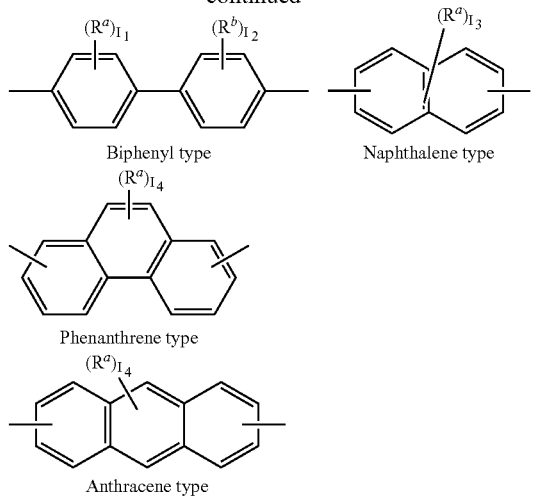

Biphenyl type

Naphthalene type

Phenanthrene type

Anthracene type

In the above formulae, $R^a$ and $R^b$ each independently represent a substituent and as the substituent, an alkyl group having 2 to 5 carbon atoms is preferable. $l_1$ and $l_2$ each independently represent an integer of 0 to 4. $l_1$ and $l_2$ are preferably 0 or 1. $l_3$ represents an integer of 0 to 6. $l_4$ represents an integer of 0 to 8. $l_3$ is preferably 0 to 2, and $l_4$ is preferably 0 or 2. In a case where $l_1$ to $l_4$ represent 2 or greater, a plurality of $R^a$'s and $R^b$'s may be the same as or different from each other.

For the diisocyanate compound, it is more preferable to combine an aromatic diisocyanate compound and an aliphatic diisocyanate compound from the viewpoint of improving folding resistance by suppressing warping after curing. As the aromatic diisocyanate compound, for example, a diisocyanate compound having a skeleton of bisphenol A type, bisphenol F type, biphenyl type, naphthalene type, phenanthrene type, or anthracene type is preferable, and a diisocyanate compound having a skeleton of bisphenol A type or bisphenol F type is more preferable. As the aliphatic diisocyanate compound, for example, hexamethylene diisocyanate, trimethylhexamethylene diisocyanate, lysine diisocyanate, and dimeric acid diisocyanate are preferable and hexamethylene diisocyanate and trimethylhexamethylene diisocyanate are more preferable.

The diol compound represented by Formula (51) is not particularly limited and can be appropriately selected according to the purpose. For example, a polyether diol compound, a polyester diol compound, a polycarbonate diol compound, and the like may be exemplified.

The urethane resin used in the present invention is preferably urethane acrylate. Examples of commercially available products thereof include Exp. DC-200 manufactured by DIC Corporation. In addition, the description of paragraphs 0036 to 0052 of JP2013-145284A can be referred to and the contents thereof are incorporated into the present specification.

<<Phenoxy Resin>>

A phenoxy resin can be generally manufactured by a one step method for causing a polycondensation reaction between bisphenol and epichlorohydrin, or a two-step method for causing a polyaddition reaction between a bifunctional epoxy resin and bisphenol.

Examples of the phenoxy resin include a bisphenol A type phenoxy resin, a bisphenol F type phenoxy resin, a bisphenol A/bisphenol F copolymerizable phenoxy resin, a bisphenol S type phenoxy resin, a brominated phenoxy resin, a phosphorus-containing phenoxy resin, and a phenoxy resin into which a fluorene skeleton is introduced. These may be used alone or in combination of a plurality of phenoxy resins.

As the phenoxy resin, from the viewpoint of curability of a light blocking portion, a bisphenol A type phenoxy resin in which $R^{12}$ in Formula (7) represents a methyl group is more preferable.

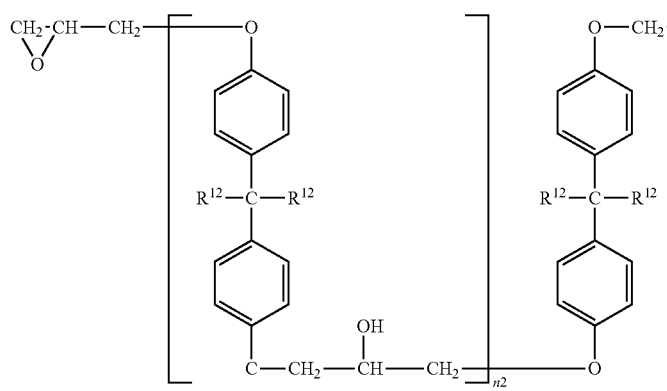

The weight-average molecular weight of the phenoxy resin is preferably $1.0 \times 10^4$ or more, more preferably $2.0 \times 10^4$ or more, and even more preferably $3.0 \times 10^4$ or more. From the same viewpoint, the weight-average molecular weight is preferably $1.0 \times 10^5$ or less, more preferably $8.0 \times 10^4$ or less, and even more preferably $7.0 \times 10^4$ or less. The weight-average molecular weight is a value measured by gel permeation chromatography (GPC) and calculated from the calibration curve using standard polystyrene.

As the phenoxy resin, a commercially available product can be used. Examples of the commercially available product include YP-50, YP-50S, YP-55, YP-70 or FX280 (trade names, all manufactured by Nippon Steel & Sumikin Chemical Co., Ltd.), JER1256, JER4250, and JER4275 (trade names, all manufactured by Mitsubishi Chemical Corporation), and PKHB, PKHC, PKHJ, PKFE, PKHP-200, PKHP-80, PKHB-100, and PKHB-300 (trade names, all manufactured by InChem Corporation).

<<Siloxane Polymer>>

As the siloxane polymer in the present invention, a polymer having a siloxane bond can be widely used, and a siloxane polymer having a repeating unit represented by Formula (1) can be used.

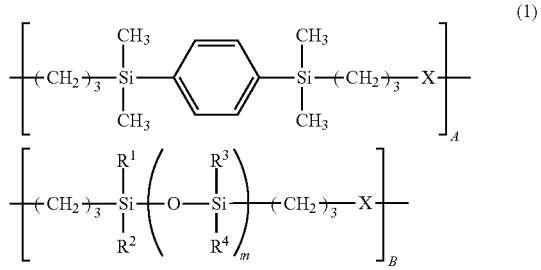

In Formula (1), $R^1$ to $R^4$ represent a monovalent hydrocarbon group such as an alkyl group having 1 to 8 carbon atoms which may be the same as or different from each other. m represents an integer of 1 to 100, B represents a positive number, and A represents 0 or a positive number. X represents a divalent organic group represented by Formula (2).

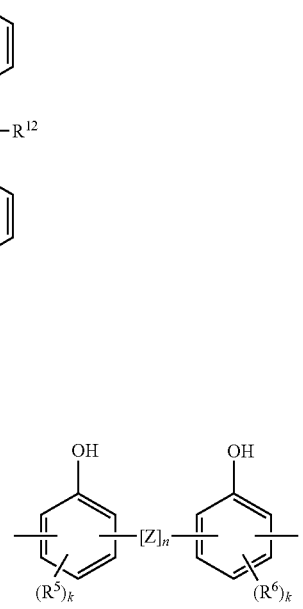

In Formula (2), Z represents a divalent organic group selected from any of the followings, and n represents 0 or 1. $R^5$ and $R^6$ each represent an alkyl group or an alkoxy group each having 1 to 4 carbon atoms, and each may be the same or different from each other. k represents any of 0, 1, and 2.

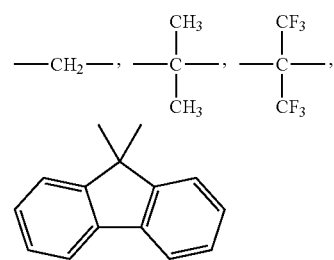

In Formula (1), specific examples of $R^1$ to $R^4$ include a methyl group, an ethyl group, and a phenyl group, and m preferably represents an integer of 3 to 60 and more preferably represents an integer of 8 to 40. In addition, B/A represents 0 to 20, particularly 0.5 to 5.

Regarding the details of the siloxane polymer, the description of paragraphs 0038 to 0044 of JP2013-243350A can be referred to and the contents thereof are incorporated into the present specification.

In addition, as the siloxane polymer, a thermoplastic siloxane polymer can be used.

The thermoplastic siloxane polymer is preferably a material in which an organopolysiloxane containing an $R^{21}R^{22}R^{23}SiO_{1/2}$ unit ($R^{21}$, $R^{22}$, and $R^{23}$ each represent an unsubstituted or substituted monovalent hydrocarbon group having 1 to 10 carbon atoms or a hydroxyl group), and a $SiO_{4/2}$ unit, with a molar ratio of the $R^{21}R^{22}R^{23}SiO_{1/2}$ unit/$SiO_{4/2}$ unit of 0.6 to 1.7, and an organopolysiloxane represented by Formula (4) are partially subjected to dehydration condensation, the ratio of the organopolysiloxane and the organopolysiloxane resin to be subjected to dehydration condensation is 99:1 to 50:50, and the weight-average molecular weight is 200,000 to 1,500,000.

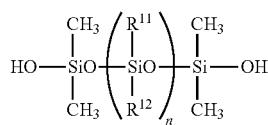

Formula (4)

(In the formula, $R^{11}$ and $R^{12}$ each represent an unsubstituted or substituted monovalent hydrocarbon group having 1 to 10 carbon atoms, and n represents 5,000 to 10,000.)

In Formula (4), the organic substituents $R^{11}$ and $R^{12}$ each represent an unsubstituted or substituted monovalent hydrocarbon group having 1 to 10 carbon atoms, and specifically, there may be mentioned a hydrocarbon group including an alkyl group such as a methyl group, an ethyl group, an n-propyl group, an isopropyl group, an n-butyl group, a t-butyl group, an n-pentyl group, a cyclopentyl group, or an n-hexyl group, a cycloalkyl group such as a cyclohexyl group, an aryl group such as a phenyl group, or a tolyl group, a group in which a part or whole of the hydrogen atom(s) of the above groups is/are substituted by a halogen atom(s), preferably a methyl group and a phenyl group.

The weight-average molecular weight of the thermoplastic organopolysiloxane is preferably 200,000 or more and more preferably 350,000 or more, and 1,500,000 or less and more preferably 1,000,000 or less. Further, the content of a low molecular weight component having a molecular weight of 740 or less is 0.5% by mass or less, and more preferably 0.1% by mass or less.

Examples of commercially available products include SILRES 604 (manufactured by Wacker Asahi Kasei Silicone Co., Ltd.).

<<Cycloolefin-Based Polymer>>

Examples of the cycloolefin-based polymer include a norbornene-based polymer, a monocyclic cycloolefin-based polymer, a cyclic conjugated diene-based polymer, a vinyl alicyclic hydrocarbon-based polymer, and a hydrogenated product thereof. Preferable examples of the cycloolefin-based polymer include an addition (co)polymer including at least one repeating unit represented by Formula (II), and an addition (co)polymer including at least one repeating unit represented by Formula (I). In addition, preferable another example of the cycloolefin-based polymer includes an addition (co)polymer including at least one repeating unit represented by Formula (III).

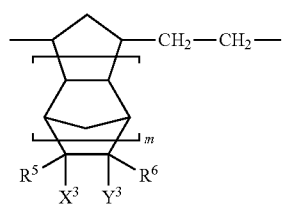

(III)

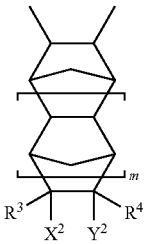

(II)

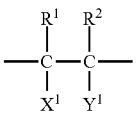

(I)

In the formulae, m represents an integer of 0 to 4. $R^1$ to $R^6$ each represent a hydrogen atom or a hydrocarbon group having 1 to 10 carbon atoms, $X^1$ to $X^3$ and $Y^1$ to $Y^3$ each represent a hydrogen atom, a hydrocarbon group having 1 to 10 carbon atoms, a halogen atom, a hydrocarbon group having 1 to 10 carbon atoms and substituted with a halogen atom, $-(CH_2)_nCOOR^{11}$, $-(CH_2)_nOCOR^{12}$, $-(CH_2)nNCO$, $-(CH_2)nNO_2$, $-(CH_2)nCN$, $-(CH_2)nCONR^{13}R^{14}$, $-(CH_2)nNR^{15}R^{16}$, $-(CH_2)nOZ$, $-(CH_2)nW$, or $(-CO)_2O$, $(-CO)_2NR^{17}$ constituted of $X^1$ and $Y^1$ and $X^2$ and $Y^2$, or $X^3$ and $Y^3$. $R^{11}$, $R^{12}$, $R^{13}$, $R^{14}$, $R^{15}$, $R^{16}$, and $R^{17}$ each represent a hydrogen atom or a hydrocarbon group (preferably a hydrocarbon group having 1 to 20 carbon atoms), Z represents a hydrocarbon group or a halogen-substituted hydrocarbon group, and W represents $SiR^{18}pD3-p$ (in which $R^{18}$ represents a hydrocarbon group having 1 to 10 carbon atoms, D represents a halogen atom, $-OCOR^{18}$ or $-OR^{18}$, and p represents an integer of 0 to 3). n represents an integer of 0 to 10.

A norbornene-based polymers has been disclosed in JP1998-7732A (JP-H10-7732A), JP2002-504184A, US2004/229157A1 or WO2004/070463A1. The norbornene-based polymer can be obtained by addition polymerization of norbornene-based polycyclic unsaturated compounds. In addition, if necessary, it is possible to carry out addition polymerization of a norbornene-based polycyclic unsaturated compound with a conjugated diene such as ethylene, propylene, butene, butadiene or isoprene; or a non-conjugated diene such as ethylidene norbornene. This norbornene-based polymer was launched under the trade name of APEL from Mitsui Chemicals, Inc., in which there is a grade with a different glass transition temperature (Tg), for example, APL8008T (Tg 70° C.), APL6013T (Tg 125° C.) or APL6015T (Tg 145° C.). Pellets such as TOPAS 8007, TOPAS 5013, TOPAS 6013, and TOPAS 6015 were launched from Polyplastics Co., Ltd.

Further, Appear 3000 has been launched from Ferrania S.p.A.

The hydride of a norbornene-based polymer can be prepared by subjecting a polycyclic unsaturated compound to addition polymerization or metathesis ring-opening polymerization and then hydrogenation, as disclosed in JP1989-240517A (JP-H01-240517A), JP1995-196736A (JP-H07-196736A), JP1985-26024A (JP-S60-26024A), JP1987-19801A (JP-S62-19801A), JP2003-1159767A or JP2004-309979A.

In Formula (III), $R^5$ and $R^6$ preferably represent a hydrogen atom or a methyl group, $X^3$ and $Y^3$ preferably represent a hydrogen atom, and the other groups are appropriately selected. The norbornene-based polymer has been launched under the trade name of Arton G or Arton F from JSR Corporation, and is also commercially available under the trade name Zeonor ZF14 and ZF16, and Zeonex 250, Zeonex 280, and Zeonex 480R from Zeon Corporation.

The weight-average molecular weight of the cycloolefin-based polymer obtained by a gel permeation chromatography (GPC) method in terms of polystyrene is preferably 10,000 to 1,000,000, more preferably 50,000 to 500,000, and even more preferably 100,000 to 300,000.

In addition, as the cycloolefin-based polymer used in the present invention, cycloolefin-based polymers described in paragraphs 0039 to 0052 of JP2013-241568A are exemplified and the contents thereof are incorporated into the present specification.

<<Epoxy Resin>>

The epoxy resin is not particularly limited as long as the epoxy resin is generally used as a temporary bonding material. For example, bifunctional epoxy resins and polyfunctional epoxy resins of bisphenol A type, bisphenol F type, bisphenol S type, brominated bisphenol A type, hydrogenated bisphenol A type, bisphenol AF type, biphenyl type, naphthalene type, fluorene type, phenol novolak type, ortho-cresol novolak type, trishydroxy phenyl methane type, tetraphenylol ethane type, and the like, or epoxy resins of hydantoin type, trisglycidyl isocyanurate type, glycidyl amine type, and the like may be used. These epoxy resins can be used alone or can be used in combination of two or more thereof. Among these epoxy resins, a novolak type epoxy resin, a biphenyl type epoxy resin, a trishydroxy phenyl methane type epoxy resin, or a tetraphenylol ethane type epoxy resin is particularly preferable. These epoxy resins are preferable since the reactivity with the phenol resin as a curing agent is excellent and the heat resistance is excellent.

Further, examples of a phenol resin functioning as a curing agent for the epoxy resin include novolak type phenol resins such as phenol novolak resin, phenol aralkyl resin, cresol novolak resin, tert-butylphenol novolak resins, and nonylphenol novolak resin, resol type phenol resin, and polyoxystyrenes such as polyparaoxystyrene. These can be used alone or can be used in combination of two or more thereof. Among these phenol resins, a phenol novolak resin and a phenol aralkyl resin are particularly preferable because the connection reliability of a semiconductor device can be improved.

Regarding the formulation ratio between the epoxy resin and the phenol resin, for example, the epoxy resin and the phenol resin are formulated such that the amount of the hydroxyl groups in the phenol resin is preferably 0.5 to 2.0 equivalents and more preferably 0.8 to 1.2 equivalents per equivalent of the epoxy group in the epoxy resin components. That is, in a case where the formulation ratio between the epoxy resin and the phenol resin is out of the above range, the curing reaction does not advance sufficiently and thus the characteristics of an epoxy resin cured product is easily deteriorated.

It is preferable that at least one of the epoxy resin or the phenol resin includes one or more resins having a melting point of 50° C. or higher. By incorporating a resin having a melting point of 50° C. or higher in the resin, the temporary bonding layer is more suitably broken by tensile strength. Examples of the epoxy resin having a melting point of 50° C. or higher include AER-8039 (manufactured by Asahi Kasei Epoxy, melting point 78° C.), BREN-105 (manufactured by Nippon Kayaku Co., Ltd., melting point 64° C.), BREN-S (manufactured by Nippon Kayaku Co., Ltd., melting point 83° C.), CER-3000L (manufactured by Nippon Kayaku Co., Ltd., melting point 90° C.), EHPE-3150 (manufactured by Daicel Chemical Industries, Ltd., melting point 80° C.), EPPN-501HY (manufactured by Nippon Kayaku Co., Ltd., melting point 60° C.), ESN-165M (manufactured by Nippon Steel & Sumikin Chemical Co., Ltd., melting point 76° C.), ESN-175L (manufactured by Nippon Steel & Sumikin Chemical Co., Ltd., melting point 90° C.), ESN-175S (manufactured by Nippon Steel & Sumikin Chemical Co., Ltd., melting point 67° C.), ESN-355 (manufactured by Nippon Steel & Sumikin Chemical Co., Ltd., melting point 55° C.), ESN-375 (manufactured by Nippon Steel & Sumikin Chemical Co., Ltd., melting point 75° C.), ESPD-295 (manufactured by Sumitomo Chemical Co., Ltd., melting point 69° C.), EXA-7335 (manufactured by DIC Corporation, melting point 99° C.), EXA-7337 (manufactured by DIC Corporation, melting point 70° C.), HP-7200H (manufactured by DIC Corporation, melting point 82° C.), TEPIC-SS (manufactured by Nissan Chemical Industries, Ltd., melting point 108° C.), YDC-1312 (manufactured by Tohto Kasei Co., Ltd., melting point 141° C.), YDC-1500 (manufactured by Tohto Kasei Co., Ltd., melting point 101° C.), YL-6121HN (manufactured by Japan Epoxy Resin Co., Ltd., melting point 130° C.), YSLV-120TE (manufactured by Tohto Kasei Co., Ltd., melting point 113° C.), YSLV-80XY (manufactured by Tohto Kasei Co., Ltd., melting point 80° C.), YX-4000H (manufactured by Japan Epoxy Resin Co., Ltd., melting point 105° C.), YX-4000K (manufactured by Japan Epoxy Resin Co., Ltd., melting point 107° C.), ZX-650 (manufactured by Tohto Kasei Co., Ltd., melting point 85° C.), Epicoat 1001 (manufactured by Japan Epoxy Resin Co., Ltd., melting point 64° C.), Epicoat 1002 (manufactured by Japan Epoxy Resin Co., Ltd., melting point 78° C.), Epicoat 1003 (manufactured by Japan Epoxy Resin Co., Ltd., melting point 89° C.), Epicoat 1004 (manufactured by Japan Epoxy Resin Co., Ltd., melting point 97° C.), and Epicoat 1006FS (manufactured by Japan Epoxy Resin Co., Ltd., melting point 112° C.). Among these, AER-8039 (manufactured by Asahi Kasei Epoxy, melting point 78° C.), BREN-105 (manufactured by Nippon Kayaku Co., Ltd., melting point 64° C.), BREN-S (manufactured by Nippon Kayaku Co., Ltd., melting point 83° C.), CER-3000L (manufactured by Nippon Kayaku Co., Ltd., melting point 90° C.), EHPE-3150 (manufactured by Daicel Chemical Industries, Ltd., melting point 80° C.), EPPN-501HY (manufactured by Nippon Kayaku Co., Ltd., melting point 60° C.), ESN-165M (manufactured by Nippon Steel & Sumikin Chemical Co., Ltd., melting point 76° C.), ESN-175L (manufactured by Nippon Steel & Sumikin Chemical Co., Ltd., melting point 90° C.), ESN-175S (manufactured by Nippon Steel & Sumikin Chemical Co., Ltd., melting point 67° C.), ESN-355 (manufactured by Nippon Steel & Sumikin Chemical Co., Ltd., melting point 55° C.), ESN-375 (manufactured by Nippon Steel & Sumikin Chemical Co., Ltd., melting point 75° C.), ESPD-295 (manufactured by Sumitomo Chemical Co., Ltd., melting point 69° C.), EXA-7335 (manufactured by DIC Corporation, melting point 99° C.), EXA-7337 (manufactured by DIC Corporation, melting point 70° C.), HP-7200H (manufactured by DIC Corporation, melting point 82° C.), YSLV-80XY (manufactured by Tohto Kasei Co., Ltd., melting point 80° C.), ZX-650 (manufactured by Tohto Kasei Co., Ltd., melting point 85° C.), Epicoat 1001 (manufactured by Japan Epoxy Resin Co., Ltd., melting point 64° C.), Epicoat 1002 (manufactured by Japan Epoxy Resin Co., Ltd., melting point 78° C.), Epicoat 1003 (manufactured by Japan Epoxy Resin Co., Ltd., melting point 89° C.), and Epicoat 1004

(manufactured by Japan Epoxy Resin Co., Ltd., melting point 97° C.) are preferable. Since the melting point of these epoxy resins is not excessively high (lower than 100° C.), the semiconductor wafer can be easily mounted onto the temporary bonding layer in a case of mounting the semiconductor wafer onto the temporary bonding layer.

Examples of the phenol resin having a melting point of 50° C. or higher include DL-65 (manufactured by Meiwa Plastic Industries, Ltd., melting point 65° C.), DL-92 (manufactured by Meiwa Plastic Industries, Ltd., melting point 92° C.), DPP-L (manufactured by Nippon Oil Corporation, melting point 100° C.), GS-180 (manufactured by Gunei Chemical Industry Co., Ltd., melting point 83° C.), GS-200 (manufactured by Gunei Chemical Industry Co., Ltd., melting point 100° C.), H-1 (manufactured by Meiwa Plastic Industries, Ltd., melting point 79° C.), H-4 (manufactured by Meiwa Plastic Industries, Ltd., melting point 71° C.), HE-100C-15 (manufactured by Sumitomo Chemical Co., Ltd., melting point 73° C.), HE-510-05 (manufactured by Sumitomo Chemical Co., Ltd., melting point 75° C.), HF-1 (manufactured by Meiwa Plastic Industries, Ltd., melting point 84° C.), HF-3 (manufactured by Meiwa Plastic Industries, Ltd., melting point 96° C.) MEH-7500 (manufactured by Meiwa Plastic Industries, Ltd., melting point 111° C.), MEH-7500-3S (manufactured by Meiwa Plastic Industries, Ltd., melting point 83° C.), MEH-7800-3L (manufactured by Meiwa Plastic Industries, Ltd., melting point 72° C.) MEH-7851 (manufactured by Meiwa Plastic Industries, Ltd., melting point 78° C.) MEH-7851-3H (manufactured by Meiwa Plastic Industries, Ltd., melting point 105° C.), MEH-7851-4H (manufactured by Meiwa Plastic Industries, Ltd., melting point 130° C.), MEH-7851S (manufactured by Meiwa Plastic Industries, Ltd., melting point 73° C.), P-1000 (manufactured by Arakawa Chemical Industries, Ltd., melting point 63° C.), P-180 (manufactured by Arakawa Chemical Industries, Ltd., melting point 83° C.), P-200 (manufactured by Arakawa Chemical Industries, Ltd., melting point 100° C.), VR-8210 (manufactured by Mitsui Chemicals, Inc., melting point 60° C.), XLC-3L (manufactured by Mitsui Chemicals, Inc., melting point 70° C.) XLC-4L (manufactured by Mitsui Chemicals, Inc., melting point 62° C.), and XLC-LL (manufactured by Mitsui Chemicals, Inc., melting point 75° C.). Among these, DL-65 (manufactured by Meiwa Plastic Industries, Ltd., melting point 65° C.), DL-92 (manufactured by Meiwa Plastic Industries, Ltd., melting point 92° C.), GS-180 (manufactured by Gunei Chemical Industry Co., Ltd., melting point 83° C.), H-1 (manufactured by Meiwa Plastic Industries, Ltd., melting point 79° C.), H-4 (manufactured by Meiwa Plastic Industries, Ltd., melting point 71° C.), HE-100C-15 (manufactured by Sumitomo Chemical Co., Ltd., melting point 73° C.), HE-510-05 (manufactured by Sumitomo Chemical Co., Ltd., melting point 75° C.), HF-1 (manufactured by Meiwa Plastic Industries, Ltd., melting point 84° C.), HF-3 (manufactured by Meiwa Plastic Industries, Ltd., melting point 96° C.), MEH-7500-3S (manufactured by Meiwa Plastic Industries, Ltd., melting point 83° C.), MEH-7800-3L (manufactured by Meiwa Plastic Industries, Ltd., melting point 72° C.), MEH-7851 (manufactured by Meiwa Plastic Industries, Ltd., melting point 78° C.), MEH-7851S (manufactured by Meiwa Plastic Industries, Ltd., melting point 73° C.), P-1000 (manufactured by Arakawa Chemical Industries, Ltd., melting point 63° C.), P-180 (manufactured by Arakawa Chemical Industries, Ltd., melting point 83° C.), VR-8210 (manufactured by Mitsui Chemicals, Inc., melting point 60° C.), XLC-3L (manufactured by Mitsui Chemicals, Inc., melting point 70° C.), XLC-4L (manufactured by Mitsui Chemicals, Inc., melting point 62° C.), and XLC-LL (manufactured by Mitsui Chemicals, Inc., melting point 75° C.) are preferable.

The amount of the thermoplastic resin in the temporary bonding material of the present invention is preferably 50.00% to 99.99% by mass, more preferably 70.00% to 99.99% by mass, and particularly preferably 88.00% to 99.99% by mass, of the solid content.

The temporary bonding material of the present invention may include only one thermoplastic resin or two or more thermoplastic resins. In a case where the temporary bonding material includes two or more thermoplastic resins, the total amount thereof is preferably in the above range.

<Compound Having Si—O Structure>

The temporary bonding material of the present invention includes a compound having a Si—O structure. By incorporating such a compound in the temporary bonding material, peelability can be secured while maintaining the adhesiveness between the carrier substrate and the base material. The compound having a Si—O structure used in the present invention is not particularly limited to having a Si—O structure and a known compound can be widely used. As the compound having a Si—O structure, a compound known as a release agent is exemplified.

A first embodiment of the compound having a Si—O structure used in the present invention is a silicone (meth)acrylate. The silicone (meth)acrylate is a compound having one or two or more (meth)acrylic groups, and the number of (meth)acrylic groups in one molecule is preferably 1 to 6, more preferably 2 or 3, and even more preferably 2. The molecular weight of the silicone (meth)acrylate is preferably less than 2,000 and more preferably 300 to 1,800. The silicone (meth)acrylate is preferably a compound represented by Formula (5).

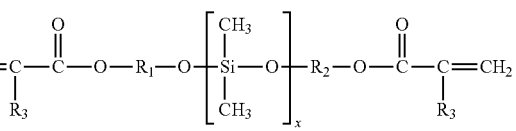

(5)

(In Formula (5), $R_1$ and $R_2$ each independently represent an alkylene oxide group, a linear aliphatic hydrocarbon group having 2 to 12 carbon atoms, a cycloaliphatic hydrocarbon group having 3 to 12 carbon atoms, an aromatic group, and a polyester group, and $R_3$ represents either H or $CH_3$.)

As the alkylene oxide group, an alkylene oxide group having 2 to 10 carbon atoms is preferable, and a polyethylene oxide group, a polypropylene oxide group, and a polytetramethylene oxide group are more preferable.

Examples of the compound represented by Formula (5) include poly(alkylene oxide) modified silicone (meth)acrylates such as TEGORAD 2250, 2100, 2200, and 2300 available from Evonik Industries AG (Mobile, Ala.), and EBECRYL 350 available from Cytec Industries, Inc. (Woodland Park, N.J.), polyester modified silicone (meth)acrylates such as MIRAMER SIP 900 available from Miwon Specialty Chemicals (South Korea), and aromatic epoxy modified silicone (meth)acrylates such as ALBIFLEX 712 also available from Evonik Industries AG. In addition, examples of other suitable (meth)acrylate modified silicone polymers include linear bifunctional water dispersible (meth)acrylate silicone prepolymers under the trade name of SILMER ACR available from Siltech Corporation (Toronto, Canada). Examples of these include SILMER ACR Di-1508, SILMER ACR Di-2510, SILMER ACR Di-1010, SILMER ACR Di-2010, and SILMER ACR Di-4515.

In addition, examples of suitable (meth)acrylate modified silicone polymers include COATOSIL 3503 and COATOSIL 3509 available from Momentive Performance Materials (Albany, N.Y.). Examples of the silicone (meth)acrylate include F-557 of MEGAFACE series manufactured by DIC Corporation.

In addition, it is needless to say that the compound having a Si—O structure described in the first embodiment may be a liquid compound as described in a second embodiment described later.

A second embodiment of the compound having a Si—O structure used in the present invention is a compound not having an ethylenically unsaturated bond. Since photocuring is not required in the present invention, even in a case of using a compound not having an ethylenically unsaturated bond, an appropriate temporary bonding layer can be formed. Examples of the compound having a Si—O structure used in the second embodiment include a silicon-based liquid compound. The liquid compound is a compound having fluidity at 25° C. and for example, means a compound having a viscosity of 1 to 100,000 mPa·s at 25° C. The viscosity of the silicon-based liquid compound at 25° C. is more preferably 10 to 20,000 mPa·s and even more preferably 100 to 15,000 mPa·s. In a case where the viscosity of the silicon-based liquid compound is in the above range, the silicon-based liquid compound is more easily unevenly distributed on the surface layer of the temporary bonding layer, and thus this case is preferable.

In the present invention, as the silicon-based liquid compound, a compound of any form of oligomer or polymer can be preferably used. In addition, a mixture of oligomer and polymer may be used. The mixture may further include a monomer. In addition, the silicon-based liquid compound may be a monomer.

The silicon-based liquid compound is preferably an oligomer, polymer, or a mixture thereof from the viewpoint of heat resistance or the like.

As the oligomer and the polymer, for example, an addition polymerization product, a polycondensate, an addition condensate, and the like can be used without any particular limitation, and a polycondensate is particularly preferable.

The weight-average molecular weight of the silicon-based liquid compound is preferably 500 to 100,000, more preferably 1,000 to 50,000, and even more preferably 2,000 to 20,000.

In the present invention, the silicon-based liquid compound is preferably a compound which is not modified at the time of treatment of the base material supplied for temporary bonding. For example, even after the base material is treated by heating at 250° C. or higher or using various chemicals, a compound that can be present in the form of liquid is preferable. Specifically, for example, after the compound is heated from the state at 25° C. to 250° C. under a temperature rising condition of 10° C./min and then cooled to 25° C., the viscosity at 25° C. is preferably 1 to 100,000 mPa·s, more preferably 10 to 20,000 mPa·s, and even more preferably 100 to 15,000 mPa·s.

The silicon-based liquid compound having such characteristics is preferably a non-curable compound not having a reactive group. Herein, the reactive group refers to whole groups which react by heating or irradiation with radiation and includes, in addition to an ethylenically unsaturated bond, other polymerizable groups, hydrolytic groups, and the like. Specific examples thereof include a (meth)acrylic group, an epoxy group, and an isocyanate group.

In addition, the 10% thermal mass reduction temperature of the silicon-based liquid compound in a case where the silicon-based liquid compound heated at a rate of 20° C./min from 25° C. is preferably 250° C. or higher and more preferably 280° C. or higher. Although the upper limit is not particularly limited, for example, the upper limit is preferably 1,000° C. or lower, and more preferably 800° C. or lower. According to the aspect, a temporary bonding layer having excellent heat resistance is easily formed. In addition, the thermal mass reduction temperature is a value measured using a thermogravimetric apparatus (TGA) in a nitrogen stream under the temperature rising condition.

The silicon-based liquid compound used in the present invention preferably contains a lipophilic group. Examples of the lipophilic group include a linear or branched alkyl group, a cycloalkyl group, and an aromatic group.

The number of carbon atoms of the alkyl group is preferably 1 to 30, more preferably 1 to 10, and even more preferably 1 to 3. Specific examples of the alkyl group include a methyl group, an ethyl group, a propyl group, a butyl group, a pentyl group, a hexyl group, a heptyl group, an octyl group, a nonyl group, a decyl group, a dodecyl group, a tetradecyl group, an octadecyl group, an isopropyl group, an isobutyl group, a sec-butyl group, a t-butyl group, a 1-ethylpentyl group, and a 2-ethylhexyl group.

The alkyl group may have a substituent. Examples of the substituent include a halogen atom, an alkoxy group, and an aromatic group. Examples of the halogen atom include a chlorine atom, a fluorine atom, a bromine atom, and an iodine atom, and a fluorine atom is preferable.

The number of carbon atoms of the alkoxy group is preferably 1 to 30, more preferably 1 to 20, and even more preferably 1 to 10. The alkoxy group is preferably linear or branched.

The aromatic group may be monocyclic or polycyclic. The number of carbon atoms of the aromatic group is preferably 6 to 20, more preferably 6 to 14, and particularly preferably 6 to 10.

The cycloalkyl group may be monocyclic or polycyclic. The number of carbon atoms of the cycloalkyl group is preferably 3 to 30, more preferably 4 to 30, even more preferably 6 to 30, and particularly preferably 6 to 20. Examples of a monocyclic cycloalkyl group include a cyclopropyl group, a cyclobutyl group, a cyclopentyl group, a cyclohexyl group, a cycloheptyl group, and a cyclooctyl group. Examples of a polycyclic cycloalkyl group include an adamantyl group, a norbornyl group, a boronyl group, a camphenyl group, a decahydronaphthyl group, a tricyclodecanyl group, a tetracyclodecanyl group, a camphoroyl group, a dicyclohexyl group, and a pinenyl group.

The cycloalkyl group may have the above-described substituent.

The aromatic group may be monocyclic or polycyclic. The number of carbon atoms of the aromatic group is preferably 6 to 20, more preferably 6 to 14, and particularly preferably 6 to 10. It is preferable that the aromatic group does not include a hetero atom (for example, a nitrogen atom, an oxygen atom, and a sulfur atom) as an element constituting the ring. Specific examples of the aromatic group include groups derived from a benzene ring, a naphthalene ring, a pentalene ring, an indene ring, an azulene ring, a heptalene ring, an indesen ring, a perylene ring, a pentacene ring, an acenaphthylene ring, a phenanthrene ring, an anthracene ring, a naphthacene ring, a chrysene ring, a triphenylene ring, a fluorene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolizine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxthin ring, a phenothiazine ring, and, a phenazine ring, and a group derived from a benzene ring is preferable.

The aromatic group may have the above-described substituent. As the substituent, a linear alkyl group is preferable.

The silicon-based liquid compound is preferably a compound represented by the following formula.

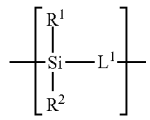

In the formula, $R^1$ and $R^2$ each independently represent a linear or branched alkyl group, a cycloalkyl group, or an aromatic group, and either $R^1$ or $R^2$ may be an organic group including a polyether chain.

In addition, $L^1$ represents —O— or a linking group including a polyether chain.

In the above formula, the preferable range of the linear or branched alkyl group, the cycloalkyl group, or the aromatic group for $R^1$ and $R^2$ is the same as the preferable range of the linear or branched alkyl group, the cycloalkyl group, or the aromatic group described in the section of the lipophilic group.

In addition, in the formula, as a preferable aspect, either $R^1$ or $R^2$ is an organic group including a polyether chain. The polyether structure in the organic group including a polyether chain may be a structure having a plurality of ether bonds and is not particularly limited. Examples thereof include polyoxyalkylene structures such as a polyethylene glycol structure (polyethylene oxide structure), a polypropylene glycol structure (polypropylene oxide structure), a polybutylene glycol (polytetramethylene glycol) structure, and a polyether structure derived from a plurality of alkylene glycols (or alkylene oxides) (for example, a poly(propylene glycol/ethylene glycol) structure). In addition, in the polyether structure derived from a plurality of alkylene glycols, the addition form of the respective alkylene glycols may be a block type (block copolymerization type) or a random type (random copolymerization type).

The organic group including a polyether chain may be an organic group constituted of only the polyether structure or an organic group having a structure in which one or two or more of the polyether structures and one or two or more linking groups (divalent groups having one or more atoms) are linked. Examples of the linking group in the organic group including a polyether chain include a divalent hydrocarbon group (particularly, a linear or branched alkylene group), a thioether group (—S—), an ester group (—COO—), an amide group (—CONH—), a carbonyl group (—CO—), a carbonate group (—OCOO—), and a group formed by bonding two or more thereof.

In addition, the polyether chain of $L^1$ in the formula may have the structure having a plurality of ether bonds and is not particularly limited. The structure having a plurality of ether bonds can be preferably used. Further, the polyether chain may be an organic group constituted of only the polyether structure or an organic group having a structure in which one or two or more of the polyether structures and one or two or more linking groups (divalent groups having one or more atoms) are linked. Examples of the linking group in the organic group including a polyether chain include a divalent hydrocarbon group (particularly, a linear or branched alkylene group), a thioether group (—S—), an ester group (—COO—), an amide group (—CONH—), a carbonyl group (—CO—), a carbonate group (—OCOO—), and a group formed by bonding two or more thereof.

The silicon-based liquid compound in the present invention is more preferably at least one compound selected from dimethyl polysiloxane, methylphenyl polysiloxane, diphenyl polysiloxane, and polyether modified polysiloxane.

Examples of the silicon-based liquid compound include those which is in the form of liquid at 25° C. among surfactants described in JP1987-36663A (JP-S62-36663A), JP1986-226746A (JP-S61-226746A), JP1986-226745A (JP-S61-226745A), JP1987-170950A (JP-S62-170950A), JP1988-34540A (JP-S63-34540A), JP1995-230165A (JP-H07-230165A), JP1996-62834A (JP-H08-62834A), JP1997-54432A (JP-H09-54432A), and JP1997-5988A (JP-H09-5988A), and JP2001-330953A.

As commercially available products, commercially available products such as trade names "BYK-300", "BYK-301/302", "BYK-306", "BYK-307", "BYK-310", "BYK-315", "BYK-313", "BYK-320", "BYK-322", "BYK-323", "BYK-325", "BYK-330", "BYK-331", "BYK-333", "BYK-337", "BYK-341", "BYK-344", "BYK-345/346", "BYK-347", "BYK-348", "BYK-349", "BYK-370", "BYK-375", "BYK-377", "BYK-378", "BYK-UV3500", "BYK-UV3510", "BYK-UV3570", "BYK-3550", "BYK-SILCLEAN3700", and "BYK-SILCLEAN3720" (all manufactured by BYK Chemie Japan K.K), trade names "AC FS 180", "AC FS 360", and "AC S 20" (all manufactured by Algin Chemie), trade names "POLYFLOWKL-400X", "POLYFLOWKL-400HF", "POLYFLOWKL-401", "POLYFLOWKL-402", "POLYFLOWKL-403", "POLYFLOWKL-404", and "POLYFLOWKL-700" (all manufactured by Kyoeisha Chemical Co., Ltd.), trade names "KP-301", "KP-306", "KP-109", "KP-310", "KP-310B", "KP-323", "KP-326", "KP-341", "KP-104", "KP-110", "KP-112", "KP-360A", "KP-361", "KP-354", "KP-355", "KP-356", "KP-357", "KP-358", "KP-359", "KP-362", "KP-365", "KP-366", "KP-368", "KP-369", "KP-330", "KP-650", "KP-651", "KP-390", "KP-391", and "KP-392" (all manufactured by Shin-Etsu Chemical Co., Ltd.), trade names "LP-7001", "LP-7002", "SH28PA", "8032 ADDITIVE", "57 ADDITIVE", "L-7604", "FZ-2110", "FZ-2105", "67 ADDITIVE", "8618 ADDITIVE", "3 ADDITIVE", and "56 ADDITIVE" (all manufactured by Dow Corning Toray Co., Ltd.), "TEGO WET 270" (manufactured by Evonik Japan Co., Ltd.), and "NBX-15" (manufactured by Neos Corporation) can be used.

In the present invention, particularly, it is preferable that the thermoplastic resin is at least one selected from an acrylic resin, a urethane resin, and a phenoxy resin, and the compound having a Si—O structure does not have an ethylenically unsaturated bond. By adopting such a structure, the effect of the present invention is more effectively exhibited. Particularly, in a case where the thermoplastic resin is an acrylic resin, the effect of the present invention is effectively exhibited.

The content of the compound having a Si—O structure included in the temporary bonding material of the present invention is preferably 0.001% by mass or more and less than 8% by mass of the thermoplastic resin. The content is more preferably 0.005% to 5% by mass. The lower limit is preferably 0.01% by mass or more. The upper limit is preferably 3% by mass or less and more preferably less than 1% by mass. As long as the content of the compound having a Si—O structure is in the above range, excellent adhesiveness and peelability are obtained. The compound having a Si—O structure may be used alone or in combination of two or more thereof. In a case of using two or more compounds having a Si—O structure in combination, the total amount thereof is preferably in the above range.

<Solvent>

The temporary bonding material of the present invention contains a solvent. As the solvent, a known solvent can be used without limitation and an organic solvent is preferable.

Examples of the organic solvent include esters such as ethyl acetate, n-butyl acetate, isobutyl acetate, amyl formate, isoamyl acetate, isobutyl acetate, butyl propionate, isopropyl butyrate, ethyl butyrate and butyl butyrate, methyl lactate, ethyl lactate, alkyloxy alkyl acetate (such as alkyloxy methyl acetate, alkyloxy ethyl acetate, alkyloxy butyl acetate (for example, methoxy methyl acetate, methoxy ethyl acetate, methoxy butyl acetate, ethoxy methyl acetate, and ethoxy ethyl acetate)), 3-alkyloxy alkyl propionate esters (such as 3-alkyloxy methyl propionate, and 3-alkyloxy ethyl propionate (for example, 3-methoxy methyl propionate, 3-methoxy ethyl propionate, 3-ethoxy ethyl propionate, and 3-ethoxy methyl propionate)), 2-alkyloxy alkyl propionate esters (such as 2-alkyloxy methyl propionate, 2-alkyloxy ethyl propionate, and 2-alkyloxy propyl propionate (for example, 2-methoxy methyl propionate, 2-methoxy ethyl propionate, 2-methoxy propyl propionate, 2-ethoxy methyl propionate, and 2-ethoxy ethyl propionate)), 2-alkyloxy-2-methyl methyl propionate and 2-alkyloxy-2-methyl ethyl propionate (for example, 2-methoxy-2-methyl methyl propionate, and 2-ethoxy-2-methyl ethyl propionate), methyl pyruvate, ethyl pyruvate, propyl pyruvate, methyl acetoacetate, ethyl acetoacetate, 2-oxobutanic acid methyl, 2-oxobutanate ethyl, and 1-methoxy-2-propyl acetate;

ethers such as diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, and propylene glycol monopropyl ether acetate;

ketones such as methylethyl ketone, cyclohexanone, 2-heptanone, 3-heptanone, N-methyl-2-pyrrolidone, and γ-butyrolactone;

aromatic hydrocarbons such as toluene, xylene, anisole, mesitylene, ethylbenzene, propylbenzene, cumene, n-butylbenzene, sec-butylbenzene, isobutylbenzene, t-butylbenzene, amylbenzene, isoamylbenzene, (2,2-dimethylpropyl) benzene, 1-phenylhexane, 1-phenylheptane, 1-phenyloctane, 1-phenylnonane, 1-phenyldecane, cyclopropylbenzene, cyclohexylbenzene, 2-ethyltoluene, 1,2-diethylbenzene, o-cymene, indane, 1,2,3,4-tetrahydronaphthalene, 3-ethyltoluene, m-cymene, 1,3-diisopropylbenzene, 4-ethyltoluene, 1,4-diethylbenzene, p-cymene, 1,4-diisopropylbenzene, 4-t-butyl toluene, 1,4-di-t-butylbenzene, 1,3-diethylbenzene, 1,2,3-trimethylbenzene, 1,2,4-trimethylbenzene, 4-t-butyl-o-xylene, 1,2,4-triethylbenzene, 1,3,5-triethylbenzene, 1,3,5-triisopropylbenzene, 5-t-butyl-m-xylene, 3,5-di-t-butyltoluene, 1,2,3,5-tetramethylbenzene, 1,2,4,5-tetramethylbenzene, and pentamethyl benzene; and hydrocarbons such as limonene, p-menthane, nonane, decane, dodecane, and decalin.

Among these, mesitylene, t-butylbenzene, 1,2,4-trimethylbenzene, p-menthane, γ-butyrolactone, anisole, 3-ethoxy methyl propionate, 3-ethoxy ethyl propionate, ethyl cellosolve acetate, ethyl lactate, diethylene glycol dimethyl ether, butyl acetate, 3-methoxy methyl propionate, 2-heptane, cyclohexanone, ethylcarbitol acetate, butylcarbitol acetate, propylene glycol methyl ether, and propylene glycol methyl ether acetate are preferable, cyclohexanone and mesitylene are more preferable, and cyclohexanone is even more preferable.

These solvents are preferably used by mixing two or more thereof from the viewpoint of improving the coating surface condition. In this case, particularly preferable is a mixed solution constituted of two or more selected from mesitylene, t-butylbenzene, 1,2,4-trimethylbenzene, p-menthane, γ-butyrolactone, anisole, 3-ethoxy methyl propionate, 3-ethoxy ethyl propionate, ethyl cellosolve acetate, ethyl lactate, diethylene glycol dimethyl ether, butyl acetate, 3-methoxy methyl propionate, 2-heptane, cyclohexanone, ethylcarbitol acetate, butylcarbitol acetate, propylene glycol methyl ether, and propylene glycol methyl ether acetate.

The content of the solvent in the temporary bonding material is such an amount that the total solid content concentration of the temporary bonding material is preferably 5% to 80% by mass, more preferably 10% to 50% by mass, and particularly preferably 15% to 40% by mass from the viewpoint of coatability.

Only one solvent may be used or two or more solvents may be used. In a case of using two or more solvents, the total amount thereof is preferably in the above range.

The solvent content in the temporary bonding layer is preferably 1% by mass or less and more preferably 0.1% by mass or less, and the temporary bonding layer particularly preferably does not contain the solvent.

<Antioxidant>

The temporary bonding material of the present invention may contain an antioxidant from the viewpoint of preventing depolymerization and gelation of elastomers by oxidation at the time of heating. As the antioxidant, a phenol-based antioxidant, a sulfur-based antioxidant, a phosphorous-based antioxidant, a quinone-based antioxidant, an amine-based antioxidant, and the like can be used.

Examples of the phenol-based antioxidant include para-methoxyphenol, 2,6-di-t-butyl-4-methylphenol, "Irganox 1010", "Irganox 1330", "Irganox 3114", and "Irganox 1035" manufactured by BASF SE, and "Sumilizer MDP-S" and "Sumilizer GA-80" manufactured by Sumitomo Chemical Co., Ltd.

Examples of the sulfur-based antioxidant include distearyl 3,3'-thiodipropionate, and "Sumilizer TPM", "Sumilizer TPS", and "Sumilizer TP-D", manufactured by Sumitomo Chemical Co., Ltd.

Examples of the phosphorous-based antioxidant include tris(2,4-di-t-butylphenyl)phosphite, bis(2,4-di-t-butylphenyl)pentaerythritol diphosphite, poly(dipropylene glycol) phenyl phosphite, diphenyl isodecyl phosphite, 2-ethylhexyl diphenyl phosphite, triphenyl phosphate, and "Irgafos 168", and "Irgafos 38" manufactured by BASF SE.

Examples of the quinone-based antioxidant include para-benzoquinone and 2-t-butyl-1,4-benzoquinone.

Examples of the amine-based antioxidant include dimethylaniline and phenothiazine.

As the antioxidant, IRGANOX 1010, Irganox 1330, distearyl 3,3'-thiodipropionate, and Sumilizer TP-D are preferable, Irganox 1010 and Irganox 1330 are more preferable, and Irganox 1010 is particularly preferable.

In addition, among the antioxidants, it is preferable to use the phenol-based antioxidant and the sulfur-based antioxidant or the phosphorous-based antioxidant in combination and it is particularly preferable to use the phenol-based antioxidant and the sulfur-based antioxidant in combination. Particularly, in a case of using a polystyrene-based elastomer as an elastomer, it is preferable to use the phenol-based antioxidant and the sulfur-based antioxidant in combination. By combining the antioxidants as described above, the effect of effectively suppressing elastomer deterioration caused by oxidation reaction can be expected. In a case where the phenol-based antioxidant and the sulfur-based antioxidant are used in combination, the mass ratio between the phenol-based antioxidant and the sulfur-based antioxidant (phenol-based antioxidant: sulfur-based antioxidant) is preferably 95:5 to 5:95 and more preferably 25:75 to 75:25.

For the combinations of the antioxidants, Irganox 1010 and Sumilizer TP-D, Irganox 1330 and Sumilizer TP-D, and, Sumilizer GA-80 and Sumilizer TP-D are preferable, Irganox 1010 and Sumilizer TP-D, and Irganox 1330 and Sumilizer TP-D are more preferable, and Irganox 1010 and Sumilizer TP-D are particularly preferable.

The molecular weight of the antioxidant is preferably 400 or more, more preferably 600 or more, and particularly preferably 750 or more from the viewpoint of preventing sublimation during heating.

In a case where the temporary bonding material has the antioxidant, the content of the antioxidant is preferably 0.001% to 20.0% by mass and more preferably 0.005% to 10.0% by mass with respect to the total solid content of the temporary bonding material.

Only one antioxidant may be used or two or more antioxidants may be used. In a case of using two or more antioxidants, the total amount thereof is preferably in the above range.

<Radically Polymerizable Compound>

The temporary bonding material of the present invention preferably includes a radically polymerizable compound. By using the temporary bonding material including a radically polymerizable compound, the flow deformation of the temporary bonding layer at the time of heating is easily suppressed. Therefore, for example, in a case where the laminate after the base material is ground is heated or the like, the flow deformation of the temporary bonding layer at the time of heating can be suppressed and the occurrence of warping can be effectively suppressed. In addition, since a hard temporary bonding layer can be formed, the temporary bonding layer is less likely to be deformed even with the pressure that is locally applied at the time of grinding the base material, and excellent flat grindability is exhibited.

In the present invention, the radically polymerizable compound is a compound having a radically polymerizable group and known compounds which are polymerizable by radicals can be used. Such compounds are widely known in the industrial field of the present invention, and can be used in the present invention without particular limitation. These compounds may have any chemical form of, for example, a monomer, a prepolymer, an oligomer, or a mixture thereof, or a polymer thereof. As the radically polymerizable compound, the description of paragraphs 0099 to 0180 of JP2015-087611A can be referred to and the contents thereof are incorporated into the present specification.

In addition, as the radically polymerizable compound, urethane acrylates as described in JP1973-41708B (JP-S48-41708B), JP1976-37193A (JP-S51-37193A), JP1990-32293B (JP-H02-32293B), and JP1990-16765B (JP-H2-16765B), urethane compounds having an ethylene oxide skeleton described in JP1983-49860B (JP-S58-49860B), JP1981-17654B (JP-S56-17654B), JP1987-39417B (JP-S62-39417B) and JP1987-39418B (JP-S62-39418B) are also suitable. In addition, addition polymerizable monomers having an amino structure or a sulfide structure in the molecule thereof described in JP1988-277653A (JP-S63-277653A), JP1988-260909A (JP-S63-260909A) and JP1989-105238A (JP-H01-105238A) may also be used as the radically polymerizable compound.

Examples of commercially available products of the radically polymerizable compound include urethane oligomers UAS-10 and UAB-140 (manufactured by Sanyo Kokusaku Pulp Co., Ltd.), NK ESTER M-40G, NK ESTER 4G, NK ESTER A-9300, NK ESTER M-9300, NK ESTER A-TMMT, NK ESTER A-DPH, NK ESTER A-BPE-4, and UA-7200 (manufactured by Shin-Nakamura Chemical Co., Ltd.), DPHA-40H (manufactured by Nippon Kayaku Co., Ltd.), UA-306H, UA-306T, UA-3061, AH-600, T-600 and AI-600 (manufactured by Kyoeisha Chemical Co., Ltd.), and BLEMMER PME400 (manufactured by NOF Co., Ltd.).

In the present invention, from the viewpoint of heat resistance, the radically polymerizable compound preferably has at least one partial structure represented by Formulae (P-1) to (P-4), and more preferably has a partial structure represented by Formula (P-3). In the formulae, * is a connecting portion.

(P-1)

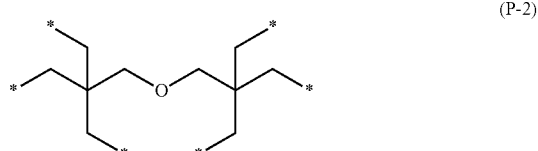

(P-2)

(P-3)

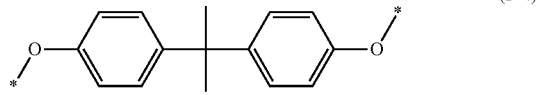

(P-4)

Specific examples of the radically polymerizable compound having a partial structure include trimethylolpropane tri(meth)acrylate, isocyanuric acid ethylene oxide modified di(meth)acrylate, isocyanuric acid ethylene oxide modified tri(meth)acrylate, triallyl isocyanurat, pentaerythritol tri(meth)acrylate, pentaerythritol tetra(meth)acrylate, dimethylolpropane tetra(meth)acrylate, dipentaerythritol penta(m- eth)acrylate, dipentaerythritol hexa(meth)acrylate, and tetramethylolmethane tetra(meth)acrylate. These radically polymerizable compounds can be particularly preferably used in the present invention.

In the temporary bonding material of the present invention, the content of the radically polymerizable compound in a case where the radically polymerizable compound is added is preferably 1% to 50% by mass, more preferably 1% to 30% by mass, and even more preferably 5% to 30% by mass with respect to the mass of the temporary bonding layer excluding the solvent from the viewpoint of good adhesiveness, flat grindability, peelability, and warping. The radically polymerizable compound may be used alone or in combination of two or more thereof.

In addition, the temporary bonding material of the present invention may not substantially include a polymerizable monomer. The expression "not substantially include" means that, the amount of the polymerizable monomer is, for example, 5% by mass or less and, further, 1% by mass or less, of the amount of the temporary bonding material included in the present invention.

<Other Components>

The temporary bonding material of the present invention can be formulated with various additives, for example, surfactants other than the compound having a Si—O structure, a plasticizer, a curing agent, a catalyst, a filler, an adhesion accelerator, an ultraviolet absorber, an aggregation preventing agent, elastomers and polymer compounds other than the above-described elastomer, and the like, within the range not impairing the effect of the present invention, if necessary. In a case where these additives are formulated, the formulation amounts of the additives are preferably 3% by mass or less and more preferably 1% by mass or less of the total solid content of the temporary bonding material, respectively. The lower limits of the amounts of the additives in a case where the additives are formulated are preferably 0.0001% by mass or more, respectively. In addition, the total formulation amount of the additives is preferably 10% by mass or less and more preferably 3% by mass or less of the total solid content of the temporary bonding material. The lower limit of the total formulation amount of these components in a case where these components are formulated is preferably 0.0001% by mass or more.

It is preferable that the temporary bonding material of the present invention does not include impurities such as metals. The content of impurities included in these materials is preferably 1 ppm or less, more preferably 1 ppb or less, even more preferably 100 ppt or less, and still even more preferably 10 ppt or less, and it is particularly preferable that the material does not substantially include impurities (at a detection limit of a measurement device or less).

As the method for removing impurities such as metals from the temporary bonding material, for example, filtration using a filter may be used. As the filter pore diameter, the pore size is preferably 10 nm or less, more preferably 5 nm or less, and still more preferably 3 nm or less. As for the material of a filter, a polytetrafluoroethylene filter, a polyethylene filter, and a polyamide resin filter are preferable. As the filter, ones which are washed with an organic solvent in advance may be used. In the step of filtration using a filter, a plurality of kinds of filters may be connected in series or in parallel, and used. In the case of using a plurality of kinds of filters, a combination of filters having different pore diameters and/or materials may be used. In addition, various materials may be filtered a plurality of times, and a step of performing filtration a plurality of times may be a circulatory filtration step.

Moreover, examples of the method for decreasing the impurities such as metals included in the temporary bonding material include a method involving, for example, performing distillation under the conditions in which contamination is inhibited as much as possible by, for example, selecting raw materials having a small content of metals as raw materials constituting the temporary bonding material, subjecting raw materials constituting the temporary bonding material to filtration using a filter, or lining the inside of a device with polytetrafluoroethylene. The preferable conditions for filtration using a filter to be performed for raw materials constituting the temporary bonding material are the same as described above.

In addition to filtration using a filter, removal of impurities by an adsorbing material may be performed, or a combination of filtration using a filter and filtration using an adsorbing material may be used. As the adsorbing material, known adsorbing materials may be used, and for example, inorganic adsorbing materials such as silica gel and zeolite, and organic adsorbing materials such as activated carbon can be used.

The viscosity of the temporary bonding material of the present invention at 25° C. is preferably 2,000 mPa·s or more, more preferably 2,050 m Pa·s or more, even more preferably 3,000 m Pa·s or more, and particularly preferably 4,000 m Pa·s or more. The upper limit is preferably 30,000 mPa·s or less, more preferably 20,000 mPa·s or less, and even more preferably 15,000 mPa·s or less.

<Preparation of Temporary Bonding Material>

The temporary bonding material of the present invention can be prepared by mixing the above-described respective components. The respective components are typically mixed at a temperature in a range of 0° C. to 100° C. In addition, after respective components are mixed, for example, filtration using a filter is preferably performed. The filtration may be performed in multistage or may be performed multiple times. In addition, the filtrate can be filtered again.

Any filter may be used without particular limitation as long as the filter is conventionally used for filtration or the like. For example, the filter may be a filter made of materials such as a fluororesin such as polytetrafluoroethylene (PTFE), a polyamide-based resin such as nylon-6 or nylon-6,6, a polyolefin resin such as polyethylene or polypropylene (PP) (including polyolefin resins having a high density and an ultra-high molecular weight), or the like. Among these materials, polypropylene (including high-density polypropylene) and nylon are preferable.

The pore diameter of the filter is suitably, for example, about 0.003 to 5.0 μm. By setting the pore diameter of the filter to be in this range, it becomes possible to reliably remove fine foreign materials such as impurities and aggregates included in the composition, while suppressing filtration clogging.

In a case of using a filter, different filters may be used in combination. In this case, filtering using a first filter may be carried out only once or two or more times. In a case of filtering two or more times by combining different filters, the pore diameter for a second or subsequent filtering is preferably made smaller than or equal to that for the first filtering. In addition, the first filters having different pore diameters in the above range may be used in combination. The pore diameter herein can be set by referring to nominal values of filter manufacturers. Commercially available filters can be selected from various filters supplied by, for example, Nihon Pall Ltd., Advantec Toyo Kaisha, Ltd., Nihon Entegris K.K. (formerly Nihon Mykrolis K.K.) or Kitz Micro Filter Corporation.

<Laminate>

Next, a laminate and a method for manufacturing the same of the present invention will be described. The laminate of the present invention has a carrier substrate, a temporary bonding layer formed by curing the temporary bonding material of the present invention, and a base material in this order.

Hereinafter, the laminate of the present invention will be described according to FIGS. 1 and 2. It is needless to say that the present invention is not limited to these drawings.

In FIG. 1, a temporary bonding layer 3 is provided between a carrier substrate 1 and a base material 2. Preferably, one surface of the temporary bonding layer 3 is in contact with the carrier substrate 1. In addition, at least a part of one surface of the temporary bonding layer 3 is preferably is in contact with the base material.

In FIG. 1, although the temporary bonding layer 3 is in contact with the entire surfaces of the carrier substrate 1 and the base material 2 (substrate surface and base material surface), in the present invention, at least a part of the temporary bonding layer may be in contact with the carrier substrate and the base material. In the present invention, it is preferable that the temporary bonding layer is in contact with the surface of the carrier substrate and the surface of the base material (substrate surface and base material surface) respectively at 80% or more.

The temporary bonding layer 3 can be formed using the temporary bonding material.

In the present invention, it is preferable that the temporary bonding layer is provided on at least one of the carrier substrate or the base material (preferably on the surface) using the temporary bonding material of the present invention. Further, it is more preferable that the temporary bonding layers are respectively independently provided on both the carrier substrate and the base material (preferably on the surfaces) using the temporary bonding material of the present invention. In this manner, by applying the temporary bonding layer on the carrier substrate and on the base material respectively, compared to a case where the temporary bonding layer is provided on only one of the carrier substrate and the base material, the respective film thicknesses are thin and the absolute value of unevenness of the adhesive surface is reduced. In addition, voids are reduced since soft layers are laminated.

Examples of the method for applying the temporary bonding material include a spin coating method, a spray method, a roller coating method, a flow coating method, a doctor coating method, a screen printing method, and a dip coating method. In addition, a method for applying the temporary bonding material by extruding the temporary bonding material from a slit-shaped opening and applying the temporary bonding material to the carrier substrate 1 may be used.

The application amount of the temporary bonding material for one layer is preferably such an application amount that the average film thickness of the temporary bonding layer after drying is, for example, 0.1 to 1,000 μm. The lower limit is preferably 1.0 μm or more, preferably 5.0 μm or more, more preferably 10.0 μm or more, and even more preferably 15.0 μm or more. The upper limit is preferably 300 μm or less, more preferably 200 μm or less, even more preferably 100 μm or less, particularly preferably 80 μm or less, further preferably 50 μm or less, further more preferably 45 μm or less, and even further preferably 30 μm or less.

In addition, in a case where two or more temporary bonding layers are provided, such an application amount that the total average film thickness of the temporary bonding layers after drying is 0.1 to 1,000 μm is preferable. The lower limit is preferably 1.0 μm or more, preferably 5.0 μm or more, more preferably 10.0 μm or more, and even more preferably 15.0 μm or more. The upper limit is preferably 300 μm or less, more preferably 200 μm or less, even more preferably 100 μm or less, particularly preferably 80 μm or less, further preferably 60 μm or less, and further more preferably 50 μm or less.

It is preferable that the temporary bonding material is applied and then dried. The drying is preferably performed, for example, at 50° C. to 250° C. for 10 to 1,000 seconds. The drying temperature is more preferably 90° C. to 220° C. and even more preferably 100° C. to 200° C. The drying time is more preferably 20 to 600 seconds and even more preferably 30 to 300 seconds. The drying may be performed by gradually raising the temperature in two stages.

One temporary bonding layer or two or more temporary bonding layers may be provided as described above. For example, as shown in FIG. 2, the temporary bonding layer may have two layers (3A, 3B) and in the present invention, the temporary bonding layer preferably includes two or more layers, more preferably includes two to four layers, and even more preferably two layers.

In a case where two or more temporary bonding layers are provided in this manner, at least one layer is formed by the temporary bonding material of the present invention and all temporary bonding layers are more preferably formed by the temporary bonding material of the present invention.

In the present invention, the peeling position of the laminate can be adjusted by providing two or more temporary bonding layers are provided and controlling the formulation amount of the compound having a Si—O structure in each temporary bonding layer. That is, in the present invention, an aspect in which the amount of the compound having a Si—O structure included in the first temporary bonding layer is different from the amount of the compound having a Si—O structure included in the second temporary bonding layer is exemplified.

Figure 2:
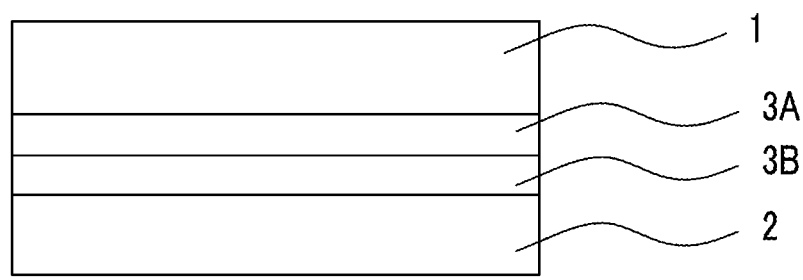
FIG. 2 is a schematic view showing another embodiment of the laminate according to the present invention.

For example, in FIG. 2, in a case where peeling occurs between the carrier substrate 1 and the temporary bonding layer 3A in contact with the carrier substrate 1, the formulation amount of the compound having a Si—O structure in the temporary bonding layer 3A is larger than the formulation amount of the compound having a Si—O structure in the temporary bonding layer 3B in contact with the base material 2. By adopting such a configuration, the adhesive strength between the carrier substrate 1 and the temporary bonding layer 3A is smaller than the adhesive strength between the base material 2 and the temporary bonding layer 3B, and thus peeling may easily occur between the carrier substrate 1 and the temporary bonding layer 3A. Particularly, in the present invention, in a case where the compound having a Si—O structure is unevenly distributed, it is possible to increase peelability while maintaining the adhesiveness, and thus this case is more preferable.

In addition, in FIG. 2, it is needless to say that an aspect of peeling occurring between the temporary bonding layer 3A and the temporary bonding layer 3B and an aspect of peeling occurring between temporary bonding layer 3B and the base material 2 are also included in the range of the present invention. Further, it is preferable to formulate a larger amount of the compound having a Si—O structure in the layer to be released.

The carrier substrate is not particularly limited and examples thereof include a silicon substrate, a glass substrate, a metal substrate, and a compound semiconductor substrate.

Among these, a silicon substrate is preferable. The thickness of the carrier substrate is not particularly limited and is, for example, preferably 300 µm to 100 mm and more preferably 300 µm to 10 mm.

In the present invention, the base material is typically a substrate to be processed and a device wafer is preferably used. A known device wafer can be used without limitation and examples thereof include a silicon substrate and a compound semiconductor substrate. Specific examples of the compound semiconductor substrate include a SiC substrate, a SiGe substrate, a ZnS substrate, a ZnSe substrate, a GaAs substrate, an InP substrate and a GaN substrate.

The device wafer preferably has a structure having a recessed portion or a protruding portion. The recessed portion or a protruding portion is generally a metal structure and examples thereof include a bump, a pillar, a circuit surface, and a chip. According to the present invention, stable temporary bonding to a device wafer having a structure on the surface can be achieved and temporary bonding to the device wafer can be easily released. The height of the structure is not particularly limited and is, for example, preferably 1 to 150 µm and more preferably 5 to 100 µm.

In addition, in the present invention, an aspect in which a chip is provided between the temporary bonding layer and the base material is also preferable. That is, an aspect in which a chip is not fixed to the base material is also included in the range of the laminate of the present invention.

In the present invention, an aspect in which the carrier substrate and the base material each independently have a transmittance of 50% or less at a wavelength of 365 nm can be provided. In the present invention, appropriate temporary bonding can be achieved without photocuring.

The thickness of the base material is preferably 500 µm or more, more preferably 600 µm or more, and even more preferably 700 µm or more. The upper limit is, for example, preferably 2,000 µm or less and more preferably 1,500 µm or less.

It is preferable that the temporary bonding layer is formed so as to fully cover a bump, a pillar, a chip, and the like on the device wafer provided on the base material. In a case where the height of the device chip is X µm and the thickness of the temporary bonding layer is Y µm, it is preferable to satisfy the relationship "X+100≥Y>X".

In the temporary bonding layer in the laminate, the density of voids having a diameter of 1 mm or more can be set to less than 150 pieces/m².

The laminate of the present invention is manufactured by pressure bonding the carrier substrate, the temporary bonding layer, and the base material. The pressure bonding is preferably performed, for example, at a temperature of 100° C. to 200° C. and a pressure of 0.01 to 1 MPa for 1 to 15 minutes.

After the pressure bonding, the base material of the laminate is processed. That is, the present invention also discloses a method for manufacturing a device substrate and also discloses a method for manufacturing a device substrate and further including processing the base material.

The processing refers to performing any operation with respect to the base material and includes treatments such as heating as well as mechanical treatments and chemical treatments.

As a first embodiment of the processing, an aspect in which the processing is heating at a temperature of 150° C. or higher and more preferably at a temperature of 150° C. to 300° C. is exemplified.

As a second embodiment of the processing, an aspect in which the processing is thinning of the surface of the base material on the side far from the temporary bonding layer exemplified.

The thinning may be performed by a mechanical treatment such as grinding or the like or by a chemical treatment. The mechanical or chemical treatment is not particularly limited and examples thereof include a thinning treatment such as grinding or chemical polishing (CMP), a treatment under high temperature and vacuum such as chemical vapor deposition (CVD) or physical vapor deposition (PVD), a treatment using a chemical such as an organic solvent, an acid treatment liquid, or a basic treatment liquid, a plating treatment, irradiation with actinic rays, and heating and cooling treatments.

The thickness of the device wafer thinned by a mechanical or chemical treatment is, for example, preferably less than 500 µm, more preferably 400 µm or less, even more preferably 300 µm or less, and particularly preferably 50 µm or less. The lower limit is, for example, preferably 1 µm or more and more preferably 5 µm or more.

In addition, in the mechanical or chemical treatment, the highest reachable temperature in the heating treatment is preferably 130° C. to 400° C. and more preferably 180° C. to 350° C. It is preferable that the highest reachable temperature in the heating treatment is lower than the decomposition temperature of the temporary bonding layer. In the heating treatment, heating is preferably performed at the highest reachable temperature for 30 seconds to 30 minutes and heating is more preferably performed at the highest reachable temperature for 1 minute to 10 minutes.

In addition, after the thinning treatment, a treatment of forming a through-hole passing from the back surface of the thinned processed substrate to the silicon substrate and forming a through-silicon electrode in the through-hole may be performed.

After the processing, the carrier substrate is peeled off from the laminate. Preferably, the carrier substrate is peeled off from the laminate by a mechanical treatment at 40° C. or lower. At this time, only the carrier substrate may be peeled off or the carrier substrate may be peeled off together with one or two or more temporary bonding layers. The peeling position can be adjusted by controlling the formulation amount of a highly releasable component to be formulated in one or two or more temporary bonding layers as described above. The peeling position in the laminate can be appropriately set according to the purpose or the like.

For example, the peeling is preferably peeling by pulling the carrier substrate upward from the end portion of the carrier substrate in a vertical direction to the processed substrate without performing any treatment. In this case, it is preferable to perform peeling after a slit between the carrier substrate and the temporary bonding layer is made with a knife or the like. The speed at separation is preferably 30 to 70 mm/min and more preferably 40 to 60 mm/min.

The temperature at peeling is preferably 40° C. or lower, more preferably 10° C. to 40° C., and even more preferably 20° C. to 30° C.

In addition to the above methods, peeling of the carrier substrate may be performed by dissolving the temporary bonding layer using a peeling liquid and separating the carrier substrate and the processed substrate. As the peeling liquid in this case, a peeling liquid used in removal of the temporary bonding layer described later can be used.

In a case where one or two or more temporary bonding layers remain together with the base material in the laminate from which the carrier substrate is peeled off, typically, the temporary bonding layer is removed.

Means for removing the temporary bonding layer is not particularly limited and the following method is preferable.

As a first embodiment of the means for removing the temporary bonding layer in the method for manufacturing a device substrate of the present invention, a method for mechanically peeling off the temporary bonding layer at 40° C. or lower in the laminate from which the carrier substrate is peeled off may be used. The mechanical peeling herein refers to peeling without performing a chemical treatment using a solvent or the like and includes peeling by hand.

The temperature at the peeling of the temporary bonding layer is preferably 40° C. or lower, more preferably 10° C. to 40° C., and even more preferably 20° C. to 30° C.

It is preferable that the temporary bonding layer is peeled off from the base material surface of the thinned processed substrate at an angle of 60° to 180°. By performing peeling at such an angle, the temporary bonding layer can be satisfactorily peeled off with small power. In addition, the temporary bonding layer is easily peeled off in a state in which the temporary bonding layers are layered.

The peeling force is a value corresponding to the adhesive force and peeling is preferably performed with the adhesive force.

As a second embodiment of the means for removing the temporary bonding layer in the method for manufacturing a device substrate of the present invention, a method for removing the temporary bonding layer by bringing the temporary bonding layer into contact with a solvent (peeling liquid) is exemplified.

Examples of the peeling liquid include aliphatic hydrocarbons (such as hexane, heptane, and ISOPAR E, H, and G (manufactured by Esso Chemical Ltd.)), aromatic hydrocarbons (such as toluene and xylene), halogenated hydrocarbons (such as methylene dichloride, ethylene dichloride, trichlene, and monochlorobenzene), and polar solvents. Examples of the polar solvents include alcohols (such as methanol, ethanol, propanol, isopropanol, 1-butanol, 1-pentanol, 1-hexanol, 1-heptanol, 1-octanol, 2-octanol, 2-ethyl-1-hexanol, 1-nonanol, 1-decanol, benzyl alcohol, ethylene glycol monomethyl ether, 2-ethoxyethanol, diethylene glycol monoethyl ether, diethylene glycol monohexyl ether, triethylene glycol monomethyl ether, propylene glycol monoethyl ether, propylene glycol monomethyl ether, polyethylene glycol monomethyl ether, polypropylene glycol, tetraethylene glycol, ethylene glycol monobutyl ether, ethylene glycol monobenzyl ether, ethylene glycol monophenyl ether, propylene glycol monophenyl ether, methyl phenyl carbinol, n-amyl alcohol, and methylamyl alcohol), ketones (such as acetone, methyl ethyl ketone, ethyl butyl ketone, methyl isobutyl ketone, and cyclohexanone), esters (ethyl acetate, propyl acetate, butyl acetate, amyl acetate, benzyl acetate, methyl lactate, butyl lactate, ethylene glycol monobutyl ether acetate, propylene glycol monomethyl ether acetate, diethylene glycol acetate, diethyl phthalate, and butyl levulinate), and others (triethyl phosphate, tricresyl phosphate, N-phenylethanolamine, N-phenyldiethanolamine, N-methyldiethanolamine, N-ethyldiethanolamine, 4-(2-hydroxyethyl)morpholine, N,N-dimethylacetamide, and N-methylpyrrolidone).

Further, the peeling liquid may contain an alkali, an acid, and a surfactant from the viewpoint of peelability. In a case of formulating these components, the formulation amounts are each preferably 0.1 to 5.0 mass % with respect to the peeling liquid.

Further, from the viewpoint of peelability, an embodiment of mixing two or more organic solvents and water or an embodiment of mixing two or more alkalis, acids and surfactants is also preferable. If necessary, the peeling liquid may contain additives such as an antifoaming agent and a hard water softening agent.

As the alkali, acid, and surfactant, the description of paragraphs 0170 to 0176 of JP2014-189696A can be referred to and the contents thereof are incorporated into the present specification.

In addition, in a case where the residue of the temporary bonding layer is attached to the carrier substrate, the carrier substrate can be regenerated by removing the residue. Examples of a method for removing the residue include a physical removal method such as a method for removing the residue by a brush, ultrasonic waves, ice particles, or aerosol spraying, and a chemical removal method such as a method for removing the residue by dissolving the residue in the peeling liquid or the like, or a method for removing the residue by decomposing and vaporizing the residue irradiation with actinic rays, radiation or heat. However, conventionally known cleaning methods can be used depending on the carrier substrate.

For example, in a case where a silicon substrate is used as the carrier substrate, conventionally known methods for cleaning a silicon wafer can be used. Examples of the aqueous solution or organic solvent that can be used in a case of chemical removal include a strong acid, a strong base, a strong oxidizing agent, and a mixture thereof, specifically, acids such as sulfuric acid, hydrochloric acid, hydrofluoric acid, nitric acid, and an organic acid, bases such as tetramethylammonium, ammonia, and an organic base, an oxidizing agent such as hydrogen peroxide, a mixture of ammonia and hydrogen peroxide, a mixture of hydrochloric acid and aqueous hydrogen peroxide, a mixture of sulfuric acid and aqueous hydrogen peroxide, a mixture of hydrofluoric acid and aqueous hydrogen peroxide, and a mixture of hydrofluoric acid and ammonium fluoride.

From the viewpoint of adhesiveness in a case of using the regenerated carrier substrate, it is preferable to use a cleaning liquid.

It is preferable that the cleaning liquid contains an acid (strong acid) having a pKa of less than 0 and hydrogen peroxide. The acid having a pKa of less than 0 is selected from an inorganic acid such as hydrogen iodide, perchloric acid, hydrogen bromide, hydrogen chloride, nitric acid, or sulfuric acid, and an organic acid such as alkylsulfonic acid or arylsulfonic acid. From the viewpoint of cleaning properties of the temporary bonding layer on the carrier substrate, an inorganic acid is preferable and sulfuric acid is most preferable.

As the hydrogen peroxide, 30 mass % hydrogen peroxide can be preferably used, and the mixing ratio of the strong acid to the 30 mass % hydrogen peroxide is preferably 0.1:1 to 100:1, more preferably 1:1 and 10:1, and most preferably 3:1 to 5:1 in terms of a mass ratio.

Thereafter, for example, the processed substrate obtained in the above method is diced for each semiconductor chip and is incorporated into a semiconductor device. That is, the present invention discloses a method for manufacturing a semiconductor device including the method for manufacturing a laminate or the method for manufacturing a device substrate. Further, a semiconductor device including the laminate is also disclosed.

In addition, in the present invention, within a range not departing from the gist of the present invention, the contents of JP2014-189731A and JP2014-189696A can be referred to and the contents thereof are incorporated into the present specification.

EXAMPLES

Hereinafter, the present invention is further specifically explained with reference to the following examples, but the present invention is not limited thereto as long as those examples do not depart from the gist of the present invention. Unless otherwise specified, "part(s)" and "%" are based on mass.

<Preparation of Temporary Bonding Material>

The following components were mixed into a homogeneous solution which was then subjected to filtration using a polytetrafluoroethylene filter having a pore diameter of 5 μm, thereby preparing temporary bonding materials of Examples and Comparative Examples respectively.

[Composition]

Thermoplastic resin shown in Table 1: part(s) by mass shown in Table 1

Additive shown in Table 1: part(s) (ppm) by mass shown in Table 1

Solvent shown in Table 1: part(s) by mass shown in Table 1

Irganox 1010 (manufactured by BASF SE): 1 part by mass

Sumilizer TP-D (manufactured by Sumitomo Chemical Co., Ltd.): 1 part by mass

The viscosity is a value obtained by measuring the viscosity of the temporary bonding material at 25° C. and moral pressure using a B type viscosity meter (VISCO-LEAD ADV H, manufactured by FUNGILAB S.A.) and a rotor (TR8).

Resins and additives shown in Table 1 are as follows.

TABLE 2

| Symbol | Trade name | Viscosity (mPa·s) | Kind | Molecular weight (resin: Mw) | Maker |
|---|---|---|---|---|---|
| P-1 | ACRYPET MF 001 | Solid | Acrylic resin | 80,000 | MITSUBISHI RAYON CO., LTD. |
| P-2 | Exp. DC-200 | Solid | Urethane resin | ≥2,000 | DIC Corporation |
| P-3 | YP-50 | Solid | Phenoxy resin | 70,000 | Nippon Steel & Sumikin Chemical Co. Ltd. |
| P-4 | A-9300-1CL | 3,500 | Acryl monomer | ≥2,000 | Shin-Nakamura Chemical Co., Ltd. |
| P-5 | LC-5200 | 2,000 | Acryl monomer | ≥2,000 | 3M Japan Limited |

The viscosity refers to viscosity at 25° C. and a case of being in a solid state at 25° C. is expressed as solid.

TABLE 1

| | Thermoplastic resin | | Additive | | Solvent | | |
|---|---|---|---|---|---|---|---|
| | Kind | Parts by mass | Kind | Parts by mass (ppm) | Kind | Parts by mass | Viscosity (mPa·s) |
| Temporary bonding material 1 (Example) | P-1 | 25 | A-1 | 250 | Cyclohexanone | 75 | ≥2,000 |
| Temporary bonding material 2 (Example) | P-1 | 25 | A-2 | 250 | Cyclohexanone | 75 | ≥2,000 |
| Temporary bonding material 3 (Example) | P-2 | 25 | A-1 | 250 | Cyclohexanone | 75 | ≥2,000 |
| Temporary bonding material 4 (Example) | P-3 | 50 | A-1 | 250 | Cyclohexanone | 50 | ≥2,000 |
| Temporary bonding material 5 (Example) | P-1 | 25 | A-1 | 100 | Cyclohexanone | 75 | ≥2,000 |
| Temporary bonding material 6 (Comparative Example) | P-1 | 25 | A-3 | 250 | Cyclohexanone | 75 | ≥2,000 |
| Temporary bonding material 7 (Comparative Example) | P-4 | 100 | A-1 | 250 | None | 0 | ≤4,000 |
| Temporary bonding material 8 (Comparative Example) | P-5 | 100 | A-1 | 250 | None | 0 | ≤4,000 |
| Temporary bonding material 9 (Comparative Example) | P-1 | 25 | None | — | Cyclohexanone | 75 | ≥2,000 |
| Temporary bonding material 10 (Comparative Example) | P-1 | 25 | A-1 | 26,000 | Cyclohexanone | 73 | ≥2,000 |

TABLE 3

| Symbol | Trade name | Kind | Maker |
|---|---|---|---|
| A-1 | BYK-348 | Polyether modified polydimethyl siloxane | BYK Chemie Japan K.K |
| A-2 | MEGAFACE F-557 | Silicone (meth)acrylate | DIC Corporation |
| A-3 | BYK-350 | Fluorine atom-containing acrylic resin (not containing silicon atom) | BYK Chemie Japan K.K |

Example 1

A silicon wafer having a diameter of 300 mm×a thickness of 775 μm (1 inch is equivalent to 2.54 cm; and a transmittance at a wavelength of 365 nm is 50% or less) was used as a carrier substrate, and the temporary bonding material 1 was applied to the surface in a film shape using a wafer bonding device (Synapse V, manufactured by Tokyo Electron Limited.). Heating was performed using a hot plate at 160° C. for 3 minutes and heating was further performed at 190° C. for 3 minutes. Thus, a temporary bonding layer was formed on the surface of the carrier substrate. At this time, the thickness of the temporary bonding layer was 40 μm.

A silicon wafer having a diameter of 300 mm×a thickness of 775 μm (having a transmittance at a wavelength of 365 nm of 50% or less) was used as a base material (substrate to be processed), and thermal pressure bonding at 200° C. and 0.51 MPa was performed for 5 minutes such that the surface of the temporary bonding layer provided on the surface of the base material and the surface of the temporary bonding layer provided on the surface of the carrier substrate were brought into contact with each other and the surface of the carrier substrate and the surface of the base material were matched without being shifted by a wafer bonding device (EVG 805, manufactured by EV Group), thereby obtaining a laminate.

The back surface of the base material of the laminate was ground using a back grinder DFG8540 (manufactured by DISCO Corporation) to a thickness of 20 μm to obtain a thinned laminate. It was confirmed that damage of the wafer by the grinding operation was not recognized and there was no shift in the junction portion of the fixed base material and temporary bonding layer.

<<Evaluation of Film Unevenness>>

A: A difference between the maximum value and the minimum value is 10 μm or less.

B: A difference between the maximum value and the minimum value is more than 10 μm and 20 μm or less.

C: A difference between the maximum value and the minimum value is more than 20 μm.

<<Evaluation of Void>>

The obtained laminate was observed using a probe of 140 MHz from the carrier substrate side using an ultrasonic imaging device (Fine SAT II, manufactured by Hitachi Power Solutions Co., Ltd.). The voids were evaluated as follows.

A: Voids having a diameter of 1 mm or more were observed at a density of less than 50 pieces/m$^2$.

B: Voids having a diameter of 1 mm or more were observed at a density of 50 pieces/m$^2$ or more and less than 150 pieces/m$^2$.

C: Voids having a diameter of 1 mm or more were observed at a density of 150 pieces/m$^2$ or more and less than 300 pieces/m$^2$.

D: Voids having a diameter of 1 mm or more were observed at a density of 300 pieces/m$^2$ or more.

<<Evaluation of Adhesive Force>>

The ground surface of the thinned laminate was set to the lower side, and the silicon wafer of the lower side was fixed to the center of a dicing tape together with a dicing frame using a dicing tape mounter. Then, using a wafer bonding device (Synapse Z, manufactured by Tokyo Electron Limited.), the silicon wafer of the upper side was pulled upward at a speed of 50 mm/min in a vertical direction to the silicon wafer of the lower side and was peeled off at 25° C.

A temporary bonding layer having a width of 90 mm was peeled off from the substrate at a speed of 300 mm/min at 90° by a force gauge (ZTS-100N, manufactured by IMADA Inc.) at 25° C. to measure the adhesive force. The adhesive force was evaluated as follows.

A: 2 N/m or more and less than 10 N/m

B: 1 N/m or more and less than 2 N/m or 10 N/m or more and 15 N/m or less

C: less than 1 N/m or more than 15 N/m

Example 2

A silicon wafer having a diameter of 300 mm×a thickness of 775 μm (having a transmittance at a wavelength of 365 nm of 50% or less) was used as a carrier substrate and the temporary bonding material 1 was applied to the surface in a film shape using the same wafer bonding device as in Example 1. Heating was performed using a hot plate at 160° C. for 3 minutes and heating was further performed at 190° C. for 3 minutes. Thus, a temporary bonding layer was formed on the surface of the carrier substrate. At this time, the thickness of the temporary bonding layer was 40 μm.

A silicon wafer having a chip mounted thereon (having a transmittance at a wavelength of 365 nm of 50% or less) was used as a base material and the temporary bonding material 1 was applied to the surface. Immediately after the wafer was rotated at a rotation speed of 1,000 rpm for 1 minute by a wafer bonding device (Synapse V, manufactured by Tokyo Electron Limited.), heating was performed at 160° C. for 3 minutes and heating was further performed at 190° C. for 3 minutes. Thus, a temporary bonding layer having an even thickness of 40 μm was prepared.

Thermal pressure bonding at 200° C. and 0.51 MPa was performed for 5 minutes such that the surface of the temporary bonding layer provided on the surface of the base material and the surface of the temporary bonding layer provided on the surface of the carrier substrate were brought into contact with each other and the surface of the carrier substrate and the surface of the base material were matched without being shifted by a wafer bonding device (EVG 805, manufactured by EV Group), thereby obtaining a laminate.

The back surface of the base material of the laminate was ground using a back grinder DFG8540 (manufactured by DISCO Corporation) to a thickness of 20 μm to obtain a thinned laminate. It was confirmed that damage of the wafer by the grinding operation was not recognized and there was no shift in the junction portion of the fixed base material and temporary bonding layer.

The obtained thinned laminate was evaluated as in the same manner as in Example 1.

Examples 3 to 6 and Comparative Examples 1 to 3

The same procedure was performed except that the temporary bonding material in Example 2 was changed the following temporary bonding materials.

TABLE 4

| | Laminate | Kind of temporary bonding material Carrier substrate side | Kind of temporary bonding material Base material side | Film unevenness | Void | Adhesive force |
|---|---|---|---|---|---|---|
| Example 1 | Single layer | 1 | — | B | B | A |
| Example 2 | Two layers | 2 | 2 | A | A | A |
| Example 3 | Two layers | 3 | 3 | A | B | A |
| Example 4 | Two layers | 4 | 4 | A | B | A |
| Example 5 | Two layers | 5 | 5 | A | A | B |
| Example 6 | Two layers | 1 | 5 | A | A | A |
| Comparative Example 1 | Two layers | 6 | 6 | A | B | C |
| Comparative Example 2 | Two layers | 7 | 7 | C | D | B |
| Comparative Example 3 | Two layers | 8 | 8 | C | B | A |
| Comparative Example 4 | Single layer | 9 | | A | B | C |
| Comparative Example 5 | Single layer | 10 | | C | C | C |

Example 7

A silicon wafer having a chip mounted thereon (having a transmittance at a wavelength of 365 nm of 50% or less) was used as a base material base material and the temporary bonding material 1 was applied to the surface. Immediately after the wafer was rotated at a rotation speed of 1,000 rpm for 1 minute by a wafer bonding device (Synapse V, manufactured by Tokyo Electron Limited.), heating was performed at 160° C. for 3 minutes and heating was further performed at 190° C. for 3 minutes. Thus, a temporary bonding layer having an even thickness of 40 μm was prepared.

A silicon wafer having a diameter of 300 mm×a thickness of 775 μm (1 inch is equivalent to 2.54 cm; and a transmittance at a wavelength of 365 nm is 50% or less) was used as a carrier substrate and thermal pressure bonding was performed for 3 minutes such that the surface of the temporary bonding layer provided on the surface of the carrier substrate and the surface of the temporary bonding layer provided on the surface of the base material were brought into contact with each other and the surface of the carrier substrate and the surface of the base material were matched without being shifted by a wafer bonding device (EVG 805, manufactured by EV Group), thereby obtaining a laminate.

The back surface of the base material of the laminate was ground using a back grinder DFG8540 (manufactured by DISCO Corporation) to a thickness of 20 μm to obtain a thinned laminate. It was confirmed that damage of the wafer by the grinding operation was not recognized and there was no shift in the junction portion of the fixed base material and temporary bonding layer.

Excellent effects were obtained as in Example 1.

Example 8

The same procedure was performed except that the solvent (cyclohexanone) in Example 2 was changed to mesitylene in the same amount. The same effects as in Example 2 were obtained.

EXPLANATION OF REFERENCES

1: carrier substrate
2: base material
3, 3A, 3B: temporary bonding layer

What is claimed is:

1. A temporary bonding material comprising:
   a thermoplastic resin;
   a compound having a Si—O structure in an amount of 0.001% by mass or more and less than 8% by mass of the thermoplastic resin; and
   a solvent,
   wherein an adhesive force of a temporary bonding layer in which the solvent is removed from the temporary bonding material with respect to a silicon wafer is 1 to 15 N/m, and
   the compound having a Si—O structure does not have an ethylenically unsaturated bond.

2. The temporary bonding material according to claim 1, wherein the thermoplastic resin is at least one selected from an acrylic resin, a urethane resin, and a phenoxy resin.

3. A laminate comprising, in order:
   a carrier substrate;
   a temporary bonding layer formed by curing the temporary bonding material according to claim 1; and
   a base material.

4. The laminate according to claim 3, wherein at least a part of the temporary bonding layer is in contact with a surface of the base material.

5. The laminate according to claim 4, wherein a chip is provided between the temporary bonding layer and the base material.

6. The laminate according to claim 5, wherein the number of temporary bonding layers is 2 or more.

7. The laminate according to claim 6, wherein an amount of a compound having a Si—O structure included in a first temporary bonding layer is different from an amount of a compound having a Si—O structure included in a second temporary bonding layer.

8. The laminate according to claim 3, wherein the carrier substrate and the base material each independently have a transmittance of 50% or less at a wavelength of 365 nm.

9. A method for manufacturing a laminate comprising:
   providing a temporary bonding layer on at least one of a carrier substrate or a base material using the temporary bonding material according to claim 1.

10. A method for manufacturing a laminate comprising:
    providing temporary bonding layers, each independently on both a carrier substrate and a base material using the temporary bonding material according to claim 1.

11. The method for manufacturing a laminate according to claim 9,
    wherein the carrier substrate and the base material each independently have a transmittance of 50% or less at a wavelength of 365 nm.

12. A method for manufacturing a device substrate comprising:
    processing the base material of the laminate according to claim 3.

13. The method for manufacturing a device substrate according to claim 12, further comprising:
    performing heating at 150° C. or higher.

14. The method for manufacturing a device substrate according to claim 12, further comprising:
peeling off the carrier substrate from the laminate at 40° C. or lower.

15. The method for manufacturing a device substrate according to claim 14, further comprising:
removing the temporary bonding layer from the laminate from which the carrier substrate is peeled off at 40° C. or lower.

16. A method for manufacturing a semiconductor device comprising:
the method for manufacturing a device substrate according to claim 12.

17. The temporary bonding material according to claim 1, wherein the compound having a Si—O structure does not have a group that reacts by heating or irradiation with radiation.

* * * * *